United States Patent
Spruit et al.

(10) Patent No.: US 12,055,475 B2
(45) Date of Patent: Aug. 6, 2024

(54) METHOD OF REDUCING FALSE-POSITIVE PARTICLE COUNTS OF AN INTERFERENCE PARTICLE SENSOR MODULE

(71) Applicants: Robert Bosch GmbH, Stuttgart (DE); TRUMPF Photonic Components GmbH, Ulm (DE)

(72) Inventors: Hans Spruit, Ulm (DE); Alexander Van der Lee, Ulm (DE); Philipp Henning Gerlach, Ulm (DE); Robert Wolf, Reutlingen (DE); Robert Weiss, Reutlingen (DE); Matthias Falk, Reutlingen (DE)

(73) Assignees: ROBERT BOSCH GMBH, Stuttgart (DE); TRUMPF PHOTONIC COMPONENTS GMBH, Ulm (DE)

( * ) Notice: Subject to any disclaimer, the term of this patent is extended or adjusted under 35 U.S.C. 154(b) by 834 days.

(21) Appl. No.: 17/128,503

(22) Filed: Dec. 21, 2020

(65) Prior Publication Data

US 2021/0116355 A1 Apr. 22, 2021

Related U.S. Application Data

(63) Continuation of application No. PCT/EP2019/067358, filed on Jun. 28, 2019.

(30) Foreign Application Priority Data

Jun. 29, 2018 (EP) .................................. 18180810

(51) Int. Cl.
*G01N 15/14* (2024.01)
*G01N 15/1434* (2024.01)
*H01S 5/183* (2006.01)

(52) U.S. Cl.
CPC ......... *G01N 15/1434* (2013.01); *H01S 5/183* (2013.01); *G01N 2015/1454* (2013.01)

(58) Field of Classification Search
CPC .............. G01N 15/1434; G01N 15/06; G01N 15/1456; G01N 15/1431;
(Continued)

(56) References Cited

U.S. PATENT DOCUMENTS

2005/0041715 A1 2/2005 Kim
2011/0184624 A1 7/2011 Han et al.
(Continued)

FOREIGN PATENT DOCUMENTS

CN 1585216 A 2/2005
CN 108139327 A 6/2018
(Continued)

OTHER PUBLICATIONS

Huarui et al., "Inversion Problem in Submicron and Nanometer Particle Sizing Using Laser Self-Mixing Interferometry," Acta Optica Sinica, Dec. 2008, pp. 2335-2343, vol. 28, No. 12, China Academic Journal Electronic Publishing House, Beijing, China.
(Continued)

*Primary Examiner* — Sang H Nguyen
(74) *Attorney, Agent, or Firm* — LEYDIG, VOIT & MAYER, LTD.

(57) ABSTRACT

A method reduces false-positive particle counts detected by an interference particle sensor module, which has a laser and a light detector. The method including: emitting laser light; providing a high-frequency signal during the emission of the laser light, a modulation frequency of the high-frequency signal being between 10-500 MHz; detecting an optical response by the light detector in reaction to the emitted laser light while providing the high-frequency signal, which is arranged such that a detection signal caused by a macro-
(Continued)

scopic object positioned between a first and second distance is reduced in comparison to a detection signal caused by the macroscopic object at the same position without providing the high-frequency signal. The high-frequency signal is provided to a tuning structure of the particle sensor module which is arranged to modify a resonance frequency of an optical resonator comprised by the laser sensor module upon reception of the high-frequency signal.

16 Claims, 14 Drawing Sheets

(58) Field of Classification Search
CPC ........ G01N 2015/0046; G01B 9/02092; G01S 7/4802; G01S 7/4916; G01S 17/58; G01S 17/88; G01S 17/32; H01S 5/0264; H01S 5/18302
See application file for complete search history.

(56) References Cited

U.S. PATENT DOCUMENTS

| | | | |
|---|---|---|---|
| 2014/0370536 A1* | 12/2014 | Sharpe | G01N 15/1429 435/29 |
| 2016/0313243 A1* | 10/2016 | Dittrich | G01N 15/1434 |
| 2017/0038258 A1* | 2/2017 | Hegyi | G01J 3/2823 |
| 2017/0038299 A1 | 2/2017 | Long et al. | |
| 2017/0307502 A1* | 10/2017 | Mason | G01N 15/1459 |
| 2018/0045635 A1 | 2/2018 | Debreczeny et al. | |
| 2018/0209779 A1* | 7/2018 | Van Der Lee | G01S 7/4817 |
| 2019/0086316 A1* | 3/2019 | Rice | A61B 5/028 |
| 2019/0285537 A1* | 9/2019 | Spruit | G01N 15/06 |
| 2019/0383717 A1* | 12/2019 | Weichmann | G01N 15/1434 |
| 2020/0096314 A1* | 3/2020 | Ouweltjes | G01N 15/1434 |

FOREIGN PATENT DOCUMENTS

| | | |
|---|---|---|
| DE | 102015207289 A1 | 10/2016 |
| GB | 2407156 A | 4/2005 |
| WO | WO 0237410 A1 | 5/2002 |
| WO | WO 2017016888 A1 | 2/2017 |
| WO | WO 2017060105 A1 | 4/2017 |
| WO | WO 2017198555 A1 | 11/2017 |
| WO | WO 2017198699 A1 | 11/2017 |
| WO | WO 2018104154 A1 | 6/2018 |

OTHER PUBLICATIONS

Nicolic et al., "Self-mixing laser Doppler flow sensor an optofluidic implementation," Applied Optics, Nov. 2013, pp. 8128-8133, vol. 52, No. 33, Optical Society of America, Washington, USA.

Gimkiewicz, et al., "Compact Illumination Modules Based on High-Power VCSEL Arrays," Proceedings of SPIE, 699711, Apr. 2008, 6997, SPIE, Bellingham WA, USA.

Hangauer, et al., "The Frequency Modulation Response of Vertical-Cavity Surface-Emitting Lasers: Experiment and Theory," IEEE Journal of Selected Topics in Quantum Electronics, 1584-1593, Nov. 2011, IEEE, 17-6, Piscataway, USA.

Johnson, et al., "Two-Dimensional Coherently Coupled Vertica 1 Cavity Laser Arrays," IEEE Photonics Society Summer Topcail Meeting Series, 9-10, Jul. 2013, IEEE, Hawaii, USA.

* cited by examiner

METHOD OF REDUCING FALSE-POSITIVE PARTICLE COUNTS OF AN INTERFERENCE PARTICLE SENSOR MODULE

CROSS-REFERENCE TO PRIOR APPLICATIONS

This application is a continuation of International Patent Application No. PCT/EP2019/067358, filed on Jun. 28, 2019, which claims priority to European Patent Application No. EP 18180810.6, filed on Jun. 29, 2018. The entire disclosure of both applications is hereby incorporated by reference herein.

FIELD

The invention relates to a method of reducing false-positive particle counts detected by an interference.

BACKGROUND

DE 10 2015 207 289 A1 discloses a particle sensor apparatus having an optical emitter device that is configured to emit an optical radiation so that a volume having at least one particle possibly present therein is at least partly illuminable; an optical detector device having at least one detection surface that is struck by at least a portion of the optical radiation scattered at the at least one particle, at least one information signal regarding an intensity and/or an intensity distribution of the optical radiation striking the at least one detection surface being displayable; and an evaluation device with which an information item regarding a presence of particles, a number of particles, a particle density, and/or at least one property of particles is identifiable and displayable, the particle sensor apparatus also encompassing at least one lens element that is disposed so that the emitted optical radiation is focusable onto a focus region inside the volume. The particle sensor apparatus comprises a mirror device which is arranged to move the focus region in order to suppress influence of wind speed.

WO 2018/104154 A1 discloses a laser sensor module for particle density detection. The laser sensor module comprises: at least a first laser being adapted to emit a first measurement beam, an optical arrangement being arranged to focus at least the first measurement beam to a first measurement volume, wherein the optical arrangement is characterized by a first numerical aperture with respect to the first measurement beam, at least a first detector being adapted to determine a first self-mixing interference signal of a first optical wave within a first laser cavity of the first laser, an evaluator, wherein the evaluator is adapted to receive detection signals generated by at least the first detector in reaction to the determined first self-mixing interference signal, wherein the evaluator is further adapted to determine an average transition time of particles passing the first measurement volume in a predetermined time period based on a duration of the first self-mixing interference signals generated by the particles, wherein the evaluator is further adapted to determine a number of particles based on the first self-mixing interference signals in the predetermined time period, and wherein the evaluator is further adapted to determine a first particle density based on the average transition time, and the number of particles.

GB 2 407 156 A discloses a non-contact optical monitor providing measurement insensitive to distance between sample and device.

SUMMARY

In an embodiment, the present invention provides a method that reduces false-positive particle counts detected by an interference particle sensor module. The interference particle sensor module having a laser and a light detector. The method including: emitting laser light by the laser; providing a high-frequency signal to the interference particle sensor module during the emission of the laser light, a modulation frequency of the high-frequency signal being in the range of 10 MHz to 500 MHz; detecting an optical response by the light detector in reaction to the emitted laser light during the providing of the high-frequency signal, the high-frequency signal being arranged such that a detection signal caused by a macroscopic object positioned in a range between a first distance and a second distance of the particle sensor module is reduced in comparison to a detection signal caused by the macroscopic object at the same position without providing the high-frequency signal. The high-frequency signal is provided to a tuning structure of the particle sensor module which is arranged to modify a resonance frequency of an optical resonator comprised by the laser sensor module upon reception of the high-frequency signal.

BRIEF DESCRIPTION OF THE DRAWINGS

The present invention will be described in even greater detail below based on the exemplary figures. The invention is not limited to the exemplary embodiments. Other features and advantages of various embodiments of the present invention will become apparent by reading the following detailed description with reference to the attached drawings which illustrate the following.

DETAILED DESCRIPTION

Figure 1:
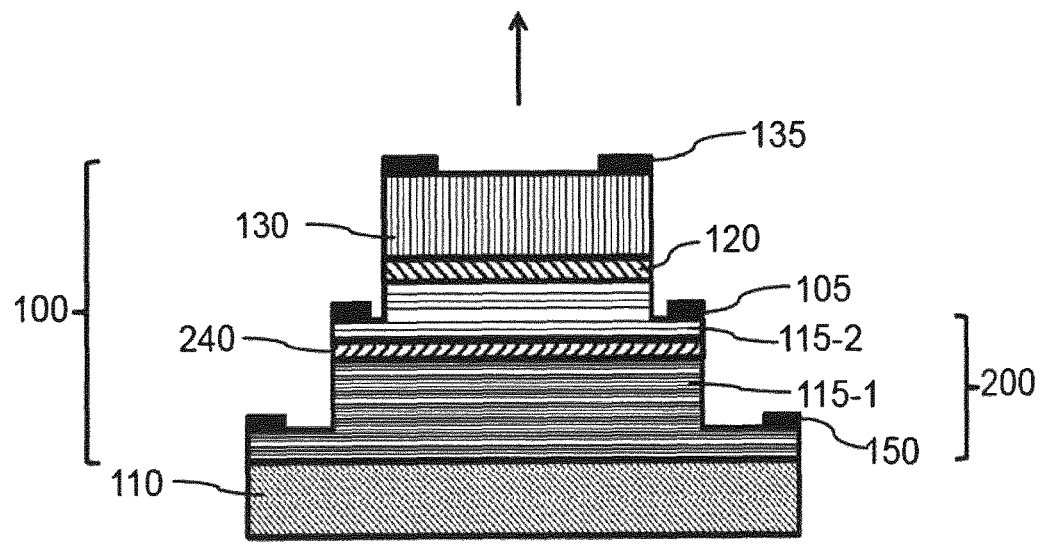
FIG. 1 shows a principal sketch of a first VCSEL with integrated light detector.

Embodiments of the present invention provide a method of reducing false-positive particle counts to improve particle detection by means of an SMI laser sensor.

According to a first aspect, a method of reducing false-positive particle counts detected by an interference particle sensor module, preferably a self-mixing interference particle sensor module is provided. The interference particle sensor module comprises a laser and a light detector. The method comprises the steps of:

emitting laser light by means of the laser, providing a high-frequency signal to the interference particle sensor module during the emission of the laser light, wherein a modulation frequency of the high-frequency signal can be chosen in the range between 10 MHz and 500 MHZ, detecting an optical response by means of the light detector in reaction to the emitted laser light when providing the high-frequency signal, wherein the high-frequency signal is arranged such that a detection signal caused by an object (also referred to as a macroscopic object) positioned in a range between a first distance (also referred to as threshold distance) and a second distance (also referred to as detection range) of the particle sensor module is reduced. The detection signal can be reduced in comparison to a detection signal caused by the (macroscopic) object at the same position without providing the high-frequency signal. The high-frequency signal may especially be arranged such that the laser emits modulated laser light in accordance with the modulation of the high-frequency signal. The optical response comprises an interference and especially a self-mixing interference signal. The detection signal is reduced by means of the high-frequency signal such that an essentially undisturbed measurement of a presence of small particles and especially a particle density by means of the light detector is enabled when applying the high-frequency signal if the (macroscopic) object is present in the range between the threshold distance and the detection range. The (macroscopic) object may be characterized by a size of at least 0.5 cm. The high-frequency signal may be provided to any tuning structure of the particle sensor module which is arranged to modify a resonance frequency of an optical resonator comprised by the laser sensor module upon reception of the high-frequency signal. Such a tuning structure may, for example, be the laser (variation of an optical length of the optical resonator caused by e.g. thermal effects caused by current variations), the light detector (arranged to vary an optical length of the optical resonator upon reception of the high-frequency signal e.g. by means of an electro-optical effect) or an additional electro-optical modulator.

Interference or more specifically self-mixing particle sensor modules are currently proposed for PM 2.5 particle detection enabling a miniature particle detector that can be used in e.g. a smartphone. These interference laser sensor modules emit for example 3 laser beams. When particles travel close to a focus position through one of these beams they will be detected. Furthermore, speed of the particles can be determined from Doppler frequencies. The combination of velocity and number of detected particles yields a measure for the particle density (e.g. PM 2.5 concentration). Further details related to SMI-based particle detection are, for example, described in WO 2017/198699 A1, WO 2017/198555 A1 and WO 2017/016888 A1 which are herewith incorporated by reference. The particle sensor module should be sensitive to detect particles at the focus position being e.g. 0.5 cm from the smartphone surface. Recent experiments have shown that such laser sensor modules are sensitive with respect to macroscopic objects (e.g. hand of a user of the mobile communication device) at more than 20 cm. The measurement results or sensor readings caused by the macroscopic object may mistakenly be interpreted as particle counts. The sensor readings should be insensitive for obstruction by macroscopic or large objects at, for instance, 20 cm from the particle sensor module to enable a more reliable particle detection.

The claimed method enables reduction of false-positive particle counts by providing a high-frequency signal to the laser, the light detector or any other element like, for example, an electrical optical modulator, which is arranged to modulate the wavelength of the emitted laser light upon the providing the high-frequency signal. This means, for example, that the laser is modulated by means of a high-frequency signal which results in a high-frequency current modulation. Alternatively or in addition, the light detector or electro-optical modulator may be modulated by means of the high-frequency signal, which results in a high-frequency voltage modulation. The electro-optical modulator may be arranged to change the optical length of the optical resonators by changing the refractive index of at least one material comprised by the electro-optical modulator upon providing the high-frequency signal. The electro-optical modulator may, for example, basically consist of a semiconductor pin junction made from material which is optically transparent at the emission or operating wavelength of the laser (e.g. VCSEL), but the absorption edge is close to the operating wavelength of the VCSEL. The change of refractive index with applied electric field is maximized in this case. The high-frequency signal may comprise a single frequency or a combination of two or more frequencies. The laser, the light detector or electro-optical modulator are modulated such that the received signal from a certain distance is minimized (see theoretical explanation provided below). The influence of a macroscopic object with respect to particle counts (false-positive particle counts caused by the detection signal) may therefore be reduced. The threshold distance means in this respect the distance at which a signal strength of the detection signal caused by macroscopic objects is sufficiently reduced. The threshold distance is greater than a particle sensitivity range of the laser sensor module at which particles smaller than 20 μm or smaller than 10 μm can be detected. The particle sensitivity range is usually smaller than 5 cm and may preferably be in a range between 0.4 cm and 2 cm. The particle sensitivity range may be determined by means of the beam shape of a laser beam emitted by the laser. The laser or the laser sensor module may comprise an optical device to focus the laser beam to a focus region to determine the particle sensitivity range. The threshold distance may therefore be, for example, 10 cm or 20 cm depending on the application in which the method is used and the expected distances at which macroscopic may be present. The detection range is the range in which a signal strength caused by the macroscopic object without high-frequency modulation is above a defined threshold value. The defined threshold value may depend on the sensitivity of the laser sensor module and the intended accuracy with respect to the detection of particle densities (e.g. qualitative or quantitative measurements). The defined threshold value may preferably be chosen such that false-positive particle counts caused by the macroscopic object are less than 200 counts per 30 seconds more preferably less than 50 counts per 30 seconds.

A modulation frequency of the high-frequency signal may be chosen out of the range between 10 MHz and 500 MHZ, preferably between 40 MHz and 200 MHz. The high frequency signal may have a modulation frequency between 10 MHz and 500 MHz, in particular between 40 MHz and 200 MHz. Experiments have shown that suppression or false-positive particle counts in the most relevant range between 20 cm to 60 cm between the particle sensor module and the macroscopic object is best in the described frequency range. Frequencies below 40 MHz or above 200 MHz may especially be used in less sensitive applications.

Particles or more precisely particle counts may be determined in the frequency domain, using a Fast Fourier Transform (FFT) of the measurement signals provided by the light detector (e.g. interference and especially self-mixing interference measurement signals). The FFT is an algorithm that samples a signal over a period of time and divides it into bins with its frequency components. The highest frequency bin corresponds to the Nyquist frequency (Nyquist bin). The Nyquist bin of this FFT is not used for particle detection. The risk that high-frequency (HF) modulation of the laser or light detector by means of the HF signal will result in false particle detection is minimized if frequency components of the HF modulation frequency coincides with the Nyquist bin which is not used for particle detection. Practically, this means that the modulation frequency or modulation frequencies of the high-frequency signal may be chosen (n+0.5)*fs with n an natural number greater than zero. The optical response is sampled at the sample frequency fs.

A modulation amplitude of the high-frequency signal is chosen such that the detection signal is minimized in the range between the threshold distance and the detection range. A bias or DC drive current may be provided to the laser. Alternatively or in addition, a bias or DC voltage may be provided to the light detector or electro-optical modulator. The maximum modulation amplitude of the current modulation or voltage modulation may be between 5% and 80%, more preferably between 20% and 60% of the DC drive current or bias voltage. Higher values between 40% and 60% may be beneficial.

The reduction of the detection signal or more precisely the signal strength of the detection signal at the threshold distance may be at least one order of magnitude, preferably at least two orders of magnitude in comparison to a signal strength of the detection signal caused by the macroscopic object received without high-frequency signal. The reduction of the signal strength of the detection signal within the range between the threshold distance and the detection range is preferably at least one order of magnitude, preferably at least two orders of magnitude in comparison to a signal strength of the detection signal received without high-frequency signal.

The high-frequency signal may be arranged such that the threshold distance is less than 50 cm, preferably less than 30 cm and most preferably less than 20 cm.

The high-frequency signal may be provided to the interference particle sensor module during the emission of the laser light such that a coherence length of the emitted laser light is reduced. The high-frequency signal can be provided to a tuning structure of the particle sensor module which is arranged to reduce the coherence length by modifying a resonance frequency of an optical resonator comprised by the laser sensor module upon reception of the high-frequency signal. The high-frequency signal may be provided to the laser, the light detector or an electrical optical modulator one or more of which may be arranged to modulate the wavelength of the emitted laser light upon the providing the high-frequency signal.

The method may comprise performing particle sensing while providing the high-frequency signal to the interference particle sensor module. Hence, in contrast to performing a separate distance measurement to determine the presence of a potentially disturbing macroscopic object, particle detection may be performed while applying the high frequency signal, wherein the high-frequency signal is arranged such that a detection signal caused by a macroscopic object positioned in a range between a first distance and a second distance of the particle sensor module is reduced. An advantage of this aspect is that no separate distance measurement may be needed. Instead, since the detection signal is reduced beyond the first distance or threshold distance anyway, the impact of a (macroscopic) object positioned beyond the first distance or threshold distance may be reduced.

The high-frequency signal may cause a high-frequency current modulation of an electrical drive current applied to the laser as described above. The high-frequency signal may alternatively or in addition cause a high-frequency voltage modulation of the light detector or electro-optical modulator. The laser, the light detector and/or an optional electro-optical modulator may be adapted to serve as the tuning structure. For example, the tuning structure may be an electro-optical modulator which is arranged to modify a resonance frequency of an optical resonator comprised by the laser sensor module upon reception of the high-frequency signal. The wavelength modulation will be partly due to thermal effects which have usually a slower time constant than the applied frequencies in the modulation signal, some (typically a small) part of the wavelength modulation will be due to direct laser current. The thermal part of the wavelength modulation will low pass filter the square modulation or sawtooth modulation of the laser current that is provided and result in a smoothed version of the applied modulation. The voltage modulation of the light detector or electro-optical modulator is not inhibited by such thermal processes and may be much faster. It may therefore be possible to provide different frequency modulation patterns like square modulation or sawtooth modulation by means of square modulation or sawtooth modulation of the high-frequency voltage modulation. The high-frequency signal provided to the tuning structure may be a square modulation signal or a sawtooth modulation signal. Theoretical considerations show that sawtooth modulation may be best suited to suppress false-positive particle counts.

The method may comprise the additional steps of:
switching off the high-frequency signal in at least one predetermined time interval,
determining the optical response in the at least one predetermined time interval,
comparing the optical response determined in the at least one predetermined time interval and the optical response determined in a preceding or subsequent time interval in which the high-frequency signal is switched on, and
determining a presence of the macroscopic object based on the comparison.

Switching on and off the high-frequency signal (e.g. in an alternating order) may enable detection of macroscopic objects in the range between the detection threshold and the detection range. The presence of such an object may be indicated by means of any kind of signal (e.g. optical or audible signal) provided to a user of a device using the method.

According to a further aspect a laser sensor comprising an interference particle sensor module and a driving circuit is provided. The interference particle sensor module comprises a laser and a light detector. The driving circuit is arranged to provide an electrical drive current to the laser for emitting laser light. The light detector is arranged to detect an optical response in reaction to the laser light emitted by the laser upon providing the electrical drive current. The laser sensor further comprises a tuning circuit. The tuning circuit is arranged to provide a high-frequency signal to the interference particle sensor module, preferably to the laser or the light detector, during the emission of the laser light wherein a modulation frequency of the high-frequency signal can be chosen in the range between 10 MHz and 500 MHz. The tuning circuit is in the latter case electrically connected to the laser or the light detector. The high-frequency signal is arranged such that a detection signal caused by an object (also referred to as a macroscopic object) positioned in a range between a first distance (also referred to as threshold distance) and a second distance (also referred to as detection range) of the particle sensor module is reduced. The detection signal can be reduced in comparison to a detection signal caused by the (macroscopic) object at the same position without providing the high-frequency signal, wherein the tuning circuit is adapted to provide the high-frequency signal to a tuning structure of the particle sensor module which is arranged to modify a resonance frequency of an optical resonator comprised by the laser sensor module upon reception of the high-frequency signal. The detection signal is received by the light detector when providing the high-frequency signal. The high-frequency signal may especially be arranged such that the laser emits modulated laser light in accordance with the modulation of the high-frequency signal.

The laser comprises an optical resonator. The light detector may be integrated in the optical resonator. The arrangement of a light detector (e.g. photo diode or photo transistor) integrated in the optical resonator may especially be suited for measuring self-mixing interference signals.

The laser may, for example, comprise a Vertical Cavity Surface Emitting Laser (VCSEL). The VCSEL comprises a first electrical contact, a second electrical contact and the optical resonator. The optical resonator comprises a first distributed Bragg reflector (DBR), a second DBR and an active layer arranged between the first distributed Bragg reflector and the second distributed Bragg reflector. The VCSEL may comprise further layers or layer arrangements as, for example, one or more current confinement layer (current aperture) to confine the electrical current to a defined area of the active layer.

The tuning circuit may be comprised by the driving circuit. The tuning circuit is, in this embodiment, arranged such that the high-frequency signal causes a high-frequency current modulation of the electrical drive current applied to the laser. Applying, for example, an asymmetric square wave to the laser current may result in a sawtooth like thermal modulation. Asymmetric square wave means a square wave that has no DC content, i.e. as much are above zero as below zero, but the transition point is not half way in the modulation pattern. The duration of the part above and below zero Volt is therefore arranged such that the integral over time of one square pulse above zero is the same as the integral over time of one square pulse below zero.

The tuning circuit may alternatively be arranged such that the high-frequency signal causes a high-frequency voltage modulation of the light detector and/or electro-optical modulator as discussed above.

A particle detector may comprise the laser sensor according to any embodiment described above and an evaluator. The particle detector comprises an optical focusing device for focusing the emitted laser light to a focus region. The focus region is at a distance to the focusing device of less than 3 cm, preferably less than 2 cm, and more preferably less than 1 cm. The focus region is preferably at a distance between 0.2 cm and 1 cm. The distance is smaller than the threshold distance as described above. The tuning circuit is arranged to provide the high-frequency signal characterized by a modulation frequency and a modulation amplitude. The modulation frequency and the modulation amplitude are arranged such that a sensitivity of the laser sensor is reduced with respect to the detection of detection signals related to a macroscopic object at least by one order of magnitude, preferably two orders of magnitude at the threshold distance, preferably in the range between the threshold distance and the detection range. The evaluator is arranged to determine a particle density of particles with a size between 0.05 μm to 10 μm, preferably between 0.1 μm and 2.5 μm (PM 2.5) based on measurement signals provided by the light detector.

The particle density may be determined with respect to only a part of the ranges of particle sizes. The measurement signals may be detected by means of the light detector when applying the high-frequency signal. The high-frequency signal may be applied permanently or in predetermined time periods. Applying the high-frequency signal in predetermined time periods (e.g. switching the tuning voltage regularly on and off) may enable detection of the macroscopic object by comparing measurement signals determined in a time period in which the high-frequency signal is switched off with measurement signals determined in time periods in which the high-frequency signal is switched on.

An air purifier, an exhaust hood, a car, a sensor box or a wearable device like a mobile communication device and the like may comprise the laser sensor or particle detector according to any embodiment as described above. The devices are arranged to communicate a particle density determined by means of the laser sensor or the particle detector to a user of the respective device.

According to a further aspect, a computer program product is presented. The computer program product comprises code means which can be saved on at least one memory device of the laser sensor or on at least one memory device of a device comprising the laser sensor. The code means are arranged such that the method according to embodiments described above can be executed by means of at least one processing device of the laser sensor or by means of at least one processing device of the device comprising the laser sensor.

The memory device or the processing device may be comprised by the laser sensor (e.g. electrical driver, evaluator etc.) or the device comprising the laser sensor. A first memory device and/or first processing device of the device comprising the laser sensor may interact with a second memory device and/or second processing device comprised by the laser sensor.

The memory device or devices may be any physical device being arranged to store information especially digital information. The memory device may be especially selected out of the group solid-state memory or optical memory.

The processing device or devices may be any physical device being arranged to perform data processing especially processing of digital data. The processing device may be especially selected out of the group processor, microprocessor or application-specific integrated circuit (ASIC).

Further advantageous embodiments are defined below.

In the Figures, like numbers refer to like objects throughout. Objects in the Figures are not necessarily drawn to scale.

Various embodiments of the invention will now be described by means of the Figures.

Self-mixing interference is used for detecting movement of and distance to an object. Background information about self-mixing interference is described in "Laser diode self-mixing technique for sensing applications", Giuliani, G.; Norgia, M.; Donati, S. & Bosch, T., Laser diode self-mixing technique for sensing applications, Journal of Optics A: Pure and Applied Optics, 2002, 4, S. 283-S. 294 which is incorporated by reference. Detection of movement of a fingertip relative to a sensor in an optical input device is described in detail in International Patent Application No. WO 02/37410 which is incorporated by reference. The principle of self-mixing interference is discussed based on the examples presented in International Patent Application No. WO 02/37410. A diode laser having a laser cavity is provided for emitting a laser, or measuring, beam. At its upper side, the device is provided with a transparent window across which an object, for example a human finger, is moved. A lens is arranged between the diode laser and the window. This lens focuses the laser beam at or near the upper side of the transparent window. If an object is present at this position, it scatters the measuring beam. A part of the radiation of the measuring beam is scattered in the direction of the illumination beam and this part is converged by the lens on the emitting surface of the laser diode and re-enters the cavity of this laser. The radiation re-entering the cavity of the diode laser induces a variation in the gain of the laser and thus in the intensity of radiation emitted by the laser, and it is this phenomenon which is termed the self-mixing effect in a diode laser.

The change in intensity of the radiation emitted by the laser or of the optical wave in the laser cavity can be detected by a photo diode or a detector arranged to determine an impedance variation across the laser cavity. The diode or impedance detector converts the radiation variation into an electric signal, and electronic circuitry is provided for processing this electric signal.

FIG. 1 shows a principal sketch of a first VCSEL 100 with integrated light detector 200, which may be used in particle sensor module or laser sensor for particle density detection based on self-mixing interference. The first VCSEL 100 is provided on a substrate 110. The first VCSEL 100 comprises a first DBR 115 provided on the substrate 110. The first DBR 115 comprises a first part 115-1 and a second part 115-2. The first part 115-1 and the second part 115-2 of the first DBR 115 comprise pairs of layers with different refractive index to provide the reflectivity of the first DBR 115. A light detector layer arrangement 240 (e.g. semiconductor layer arrangement building the light sensitive part of a photo diode) is sandwiched between the first part 115-1 and the second part 115-2. An active layer 120 is sandwiched between the first DBR 115 and a second DBR 130 comprised by the VCSEL 100. The second DBR 130 comprises multiple pairs of layers with different refractive indices like the first DBR 115 to provide a somewhat lower reflectivity such that laser light is emitted via the second DBR 130 (top emitter). The active layer 120 comprises a bulk layer or quantum wells to generate laser light upon receiving a drive current by means of the first electrical contact 105 provided on an intermediate layer of the second part 115-2 of the first DBR 115 and a ring shaped second electrical contact 135 provided on top of the second DBR 130. A self-mixing interference signal may be measured by measuring the voltage between the first electrical contact 105 and an electrical contact 150, which is provided on an intermediate layer of the first part 115-1 of the first DBR 115. The laser driving current may be modulated by providing a high-frequency signal by means of the first electrical contact 105 and the second electrical contact 135. A high-frequency signal may be provided to the light detector layer arrangement 240 by means of the first electrical contact 105 and the third electrical contact 150, which builds together with the light detector layer arrangement 240 the light detector 200. The VCSEL 100 further comprises an electrical confinement layer (current aperture), which is integrated in one of the DBRs 115, 130. It should be clarified that FIG. 1 shows an example. The light detector may be located within the VCSEL laser cavity and the detector may function as a modulator as well as a detector. However, the detector may also be provided as a separate element.

Figure 2:
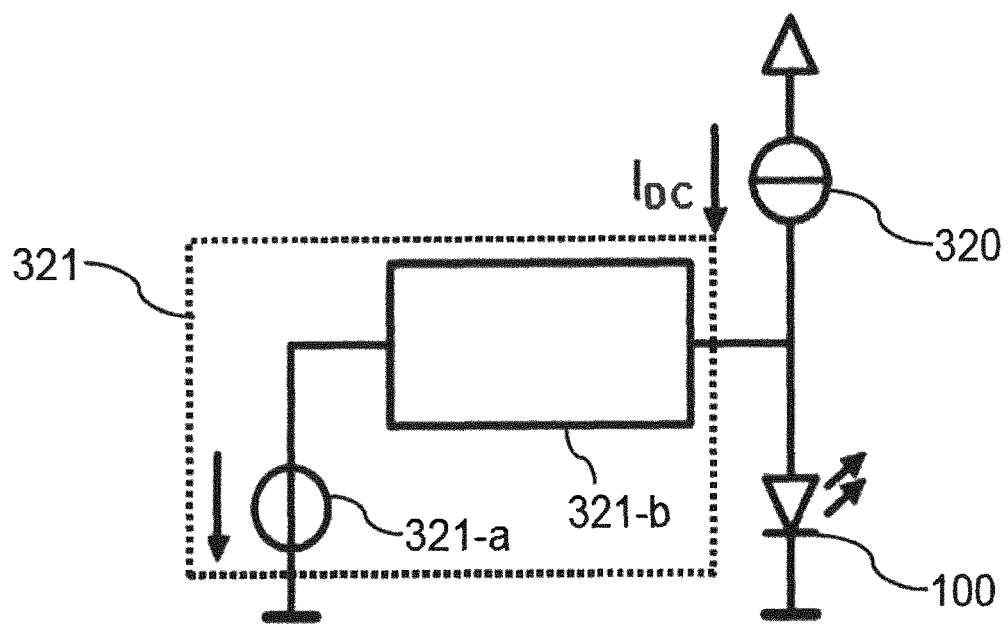
FIG. 2 shows a principal sketch of a first embodiment of a HF compensation setting.

FIG. 2 shows a principal sketch of a first embodiment of a HF compensation setting. The laser which is in this case a VCSEL 100 is electrically driven by a driving circuit 320. The driving current is modulated by means of a tuning circuit 321, which comprises a high-frequency generator 321-*a* and a passive network 321-*b*. The high-frequency generator 321-*a* provides a high-frequency square voltage with a frequency of 200 MHz to the VCSEL 100 to reduce sensitivity with respect to macroscopic objects. The high-frequency square voltage causes a corresponding current modulation, which follows the pattern from the square wave in combination with the passive network 321-*b*. The current modulation results in a wavelength modulation of laser light 315 emitted by the laser, which will be more sinusoidal in shape because of the time constants involved.

Figure 3:
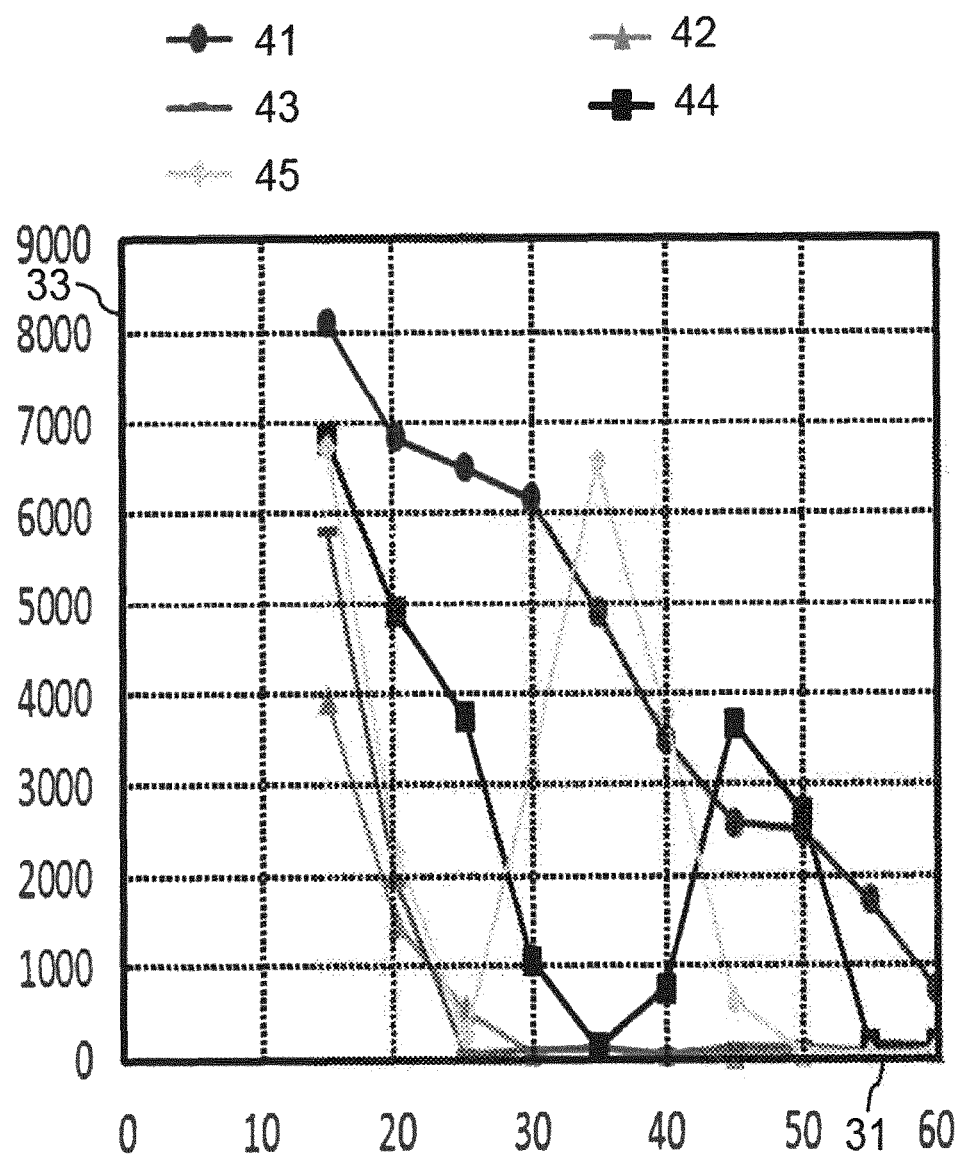
FIG. 3 shows the modulation frequency dependence of compensation of the first embodiment.

FIG. 3 shows the reduction of (false-positive) particle counts per 30 seconds 33 caused by a sheet of white paper (simulating the macroscopic object) positioned at the distance 31 for different high-frequency (HF) current modulations. The modulation of the drive current results in a modulation of the laser power of 0.1 mW with respect to an average laser power of 0.5 mW. Line 41 shows false-positive particle counts without any HF current modulation. The measurement shows that the number of false-positive particle counts without any HF current modulation is rather high (around 700 counts per 30 seconds) up to a distance of 60 cm. Line 42 shows the number of false-positive particle counts if a high-frequency signal with a frequency of 100 MHz is provided. The number of false-positive particle counts is below 100 counts per 30 seconds at distances greater than 30 cm. A high-frequency signal with a frequency of 200 MHz provides already a good suppression at a distance of around 25 cm as shown by line 43. At higher frequencies of 300 MHz (line 44) and 400 MHZ (line 45) there are local maxima of false-positive particle counts at 45 cm at 300 MHz (around 3800 counts per 30 seconds) and 35 cm at 400 MHz (around 7600 counts per 30 seconds). These peaks can be explained by considering the wavelength as a function of time. The HF modulation causes a periodic low pass filtered wavelength variation due to thermal relaxation constant in the optical resonator of the VCSEL 100. In case of the peaks, the modulation period equals the time required for the beam to return into the laser. While at HF modulation the wavelength is varied, at this specific distance the wavelength of the returning light is precisely the same as the momentary wavelength in the laser and interference still occurs. Details about the theoretical background are described below. Phase relations in the light are not important. The paper is not standing still and phase variations of the light coming back into the laser yield the unwanted signals from the sheet of paper. Reliable suppression of false-positive particle counts up to a distance of about 80 cm requires a modulation frequency below 200 MHz. On the other hand, it is required that the modulation frequency does not give too large disturbances in the detected signals from the light detector 200 (photodiode). So, for practical applications, the minimum frequency must be above 20 MHz, or more general sufficiently above the electronic detection bandwidth of the sensor. Furthermore, the particles are detected by analyzing the measurement signal received by the light detector 200 in the frequency domain, using a Fast Fourier Transform (FFT). The Nyquist bin of this FFT is not used for particle detection. So, when the HF modulation frequency coincides with the Nyquist bin, the risk that HF modulation will result in false particle detection is circumvented/minimized. Practically, this means that preferably the modulation frequency is chosen (n+0.5)*fs, where fs is the sample frequency. Summarizing, the preferred range of modulation frequencies may be: 20 MHz<(n+0.5)*fs<200 MHz.

Figure 4:
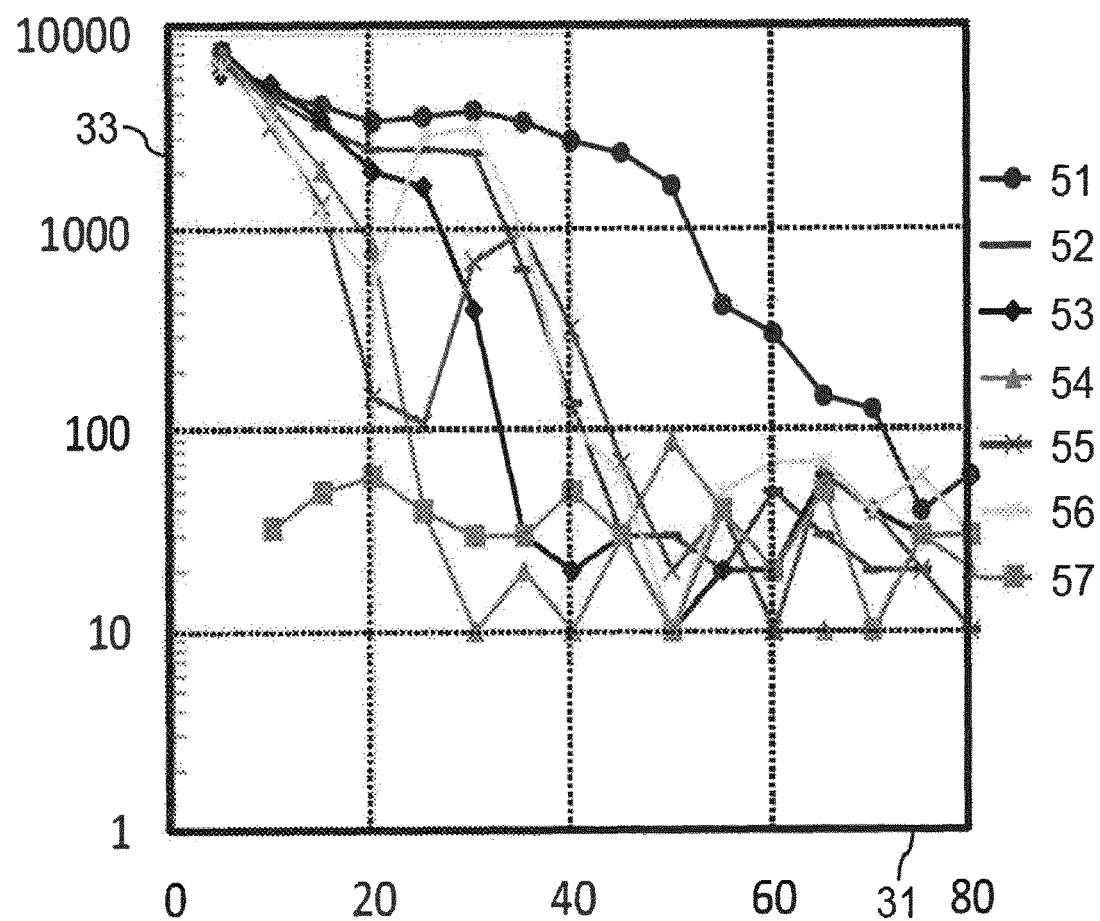
FIG. 4 shows the modulation amplitude dependence of compensation of the first embodiment.

FIG. 4 shows the reduction of (false-positive) particle counts per 30 seconds 33 caused by a sheet of white paper (macroscopic object) as a function of the distance between the sheet of white paper and the sensor for different modulation amplitudes. 1V driving voltage provided by means of the tuning circuit 321 shown in FIG. 2 results in 100 mV voltage over the VCSEL 100 and typically 0.50 mA current variation through the VCSEL and consequently 0.25 mW laser power modulation. The modulation refers to peak to peak values. The typical laser power setting is characterized by an average laser power of 0.50 mW. The modulation frequency is 93.3 MHZ (3.5 times the sample frequency of 26.7 MHz). Line 51 shows a first reference measurement without any modulation (modulation amplitude 0 V) and line 57 shows a second reference measurement without the white paper (macroscopic object) in the beam path of the sensor. Line 51 shows that the false-positive particle counts caused by the white paper decreases essentially monotonically as a function of the distance 31 in [cm] and reach the noise level indicated by line 57 at a distance 31 of around 70 cm. Line 52 is characterized by a modulation amplitude of 0.2 V, line 53 is characterized by a modulation amplitude of 0.3 V, line 54 is characterized by a modulation amplitude of 0.4 V, line 55 is characterized by a modulation amplitude of 0.6 V and line 56 is characterized by a modulation amplitude of 0.8 V. A modulation amplitude of around 0.4 V results in the best suppression of false-positive particle counts by reducing the false-positive particle counts per 30 seconds at a distance of around 25 cm up to a distance of 80 cm to the noise level. Further experiments at different modulation frequencies have come to the following results. The suppression is limited at small modulation amplitudes (see line 52). There is an amplitude range with optimum suppression. This range of modulation amplitudes depends on the modulation frequency (see discussion of FIGS. 6 and 7 below). Greater modulation amplitudes are less suited because of local maxima in the false-positive particle counts per 30 seconds (see lines 55 and 56). Due to these additional peaks, the performance is worse compared to the 0.4 V modulation amplitude. This effect may be explained as follows:

Current modulation of the interference-based particle sensor leads to an amplitude and frequency (wavelength) modulation of the laser light.

The e.g. SMI disturbance caused by a macroscopic object has a low frequency with respect to the modulation frequency.

The spectrum of the resulting phase modulation has different amplitudes of its harmonics, depending on modulation amplitude and distance of object to the sensor. Amplitudes of harmonics are given by Bessel functions.

By choosing the proper amplitude at a given modulation frequency, it is possible to make the DC term zero, this means disappearance of the SMI disturbance occurring at relatively low frequencies, so around DC in this analysis This effect can therefore be used to choose the modulation amplitude as a function of the modulation frequency such that the suppression of false-positive particle counts (e.g. per 30 seconds) is suppressed or at least reduced in the range of distances at which a disturbance by means of a macroscopic object may occur. The range of distances may depend on the respective application. A more detailed theoretical analysis is given in the theoretical considerations with respect to interference and especially self-mixing interference and current modulation below.

Best modulation amplitude may vary as a function of laser and temperature. Alternatively, instead of optimizing for each situation, a fixed modulation setting can be used. In this case, a fixed high modulation amplitude is preferred. A fixed high modulation amplitude may give a more predictable result with better worst-case performance as compared to a low fixed value.

Figure 5:
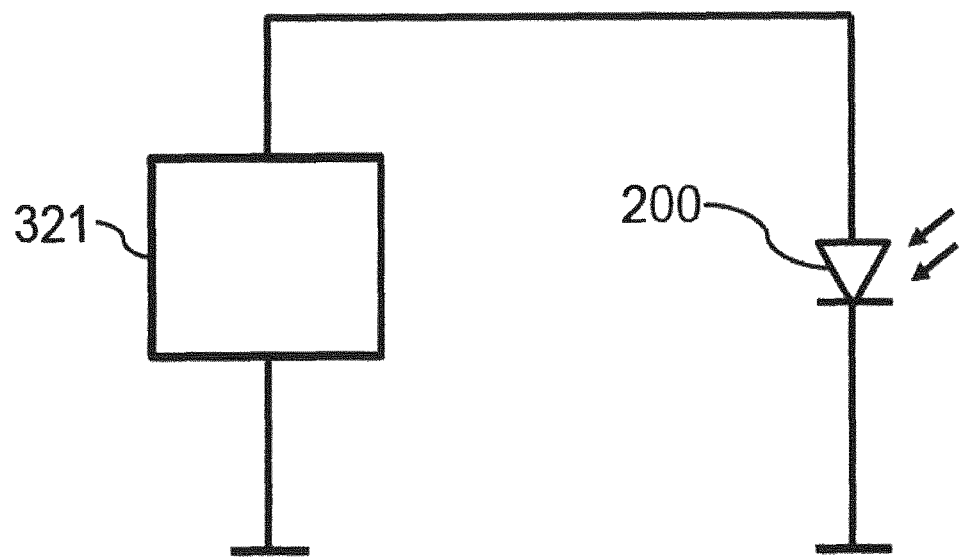
FIG. 5 shows a principal sketch of a second embodiment of a HF compensation setting.

FIG. 5 shows a principal sketch of a second embodiment of a HF compensation setting. A tuning circuit 321 is in the second embodiment arranged to provide a HF voltage modulation by means of a high-frequency signal to the light detector 200. Voltage modulation of the light detector 200 may have the advantage that the time constant is shorter in comparison to current modulation because there is essentially no heating. It may thus be easier to couple in higher frequencies. Furthermore, it is easier to use different pulse shapes like sawtooth and rectangular high-frequency pulses. Especially sawtooth modulation seems to be best suited according to the theoretical considerations to suppress false-positive particle counts.

Figure 6:
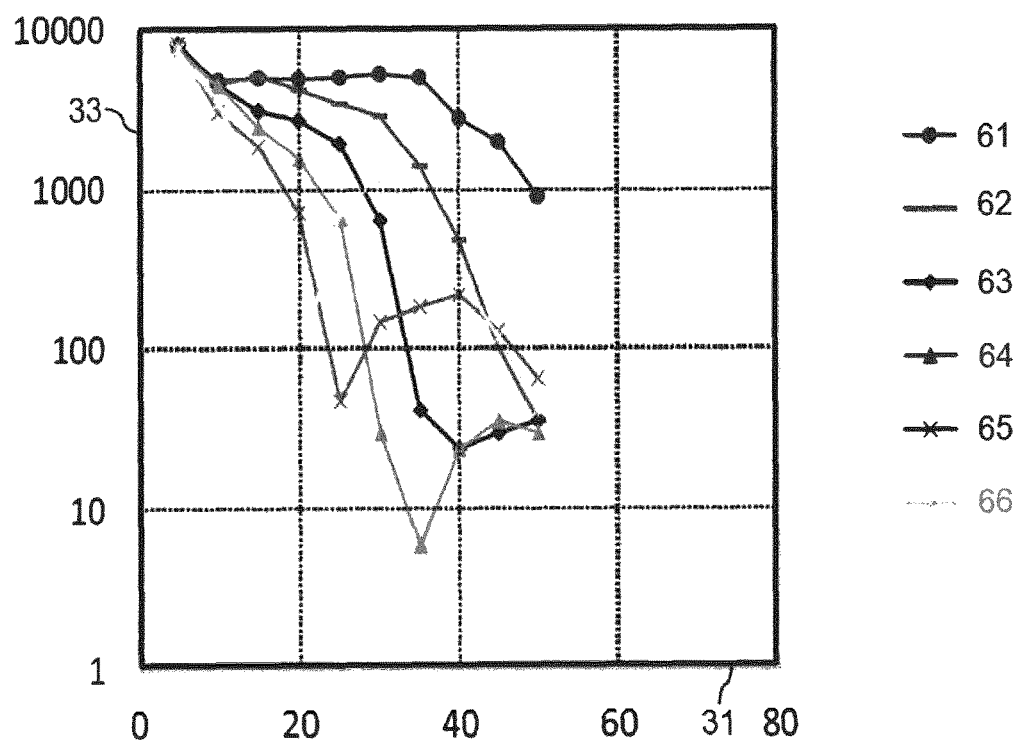
FIG. 6 shows the modulation amplitude dependence of compensation of the second embodiment at a modulation frequency of 93 MHz.

FIG. 6 shows the modulation amplitude dependence of compensation by means of a high-frequency voltage modulation applied to the light detector 200 at a modulation frequency of 93 MHz. The ordinate shows again the (false-positive) particle counts per 30 seconds 33 and the abscissa the distance 31 in [cm] between the particle sensor and a sheet of white paper which is again used as dummy for the macroscopic object. Line 61 shows again a reference measurement without high-frequency voltage modulation. Line 62 is characterized by a modulation amplitude of 0.1 V, line 63 is characterized by a modulation amplitude of 0.15 V, line 64 is characterized by a modulation amplitude of 0.2 V, line 65 is characterized by a modulation amplitude of 0.25 V and line 66 is characterized by a modulation amplitude of 0.3 V. Dependence of suppression of false-positive particle counts per 30 seconds as a function of the modulation amplitude is similar as discussed above with respect to FIG. 4. There is an intermediate modulation amplitude of 0.2 V (line 64), which result in the best suppression. Theoretical background of the suppression seems to be the same as indicated above and explained below in the theoretical considerations with respect to interference and especially self-mixing interference current modulation below.

Figure 7:
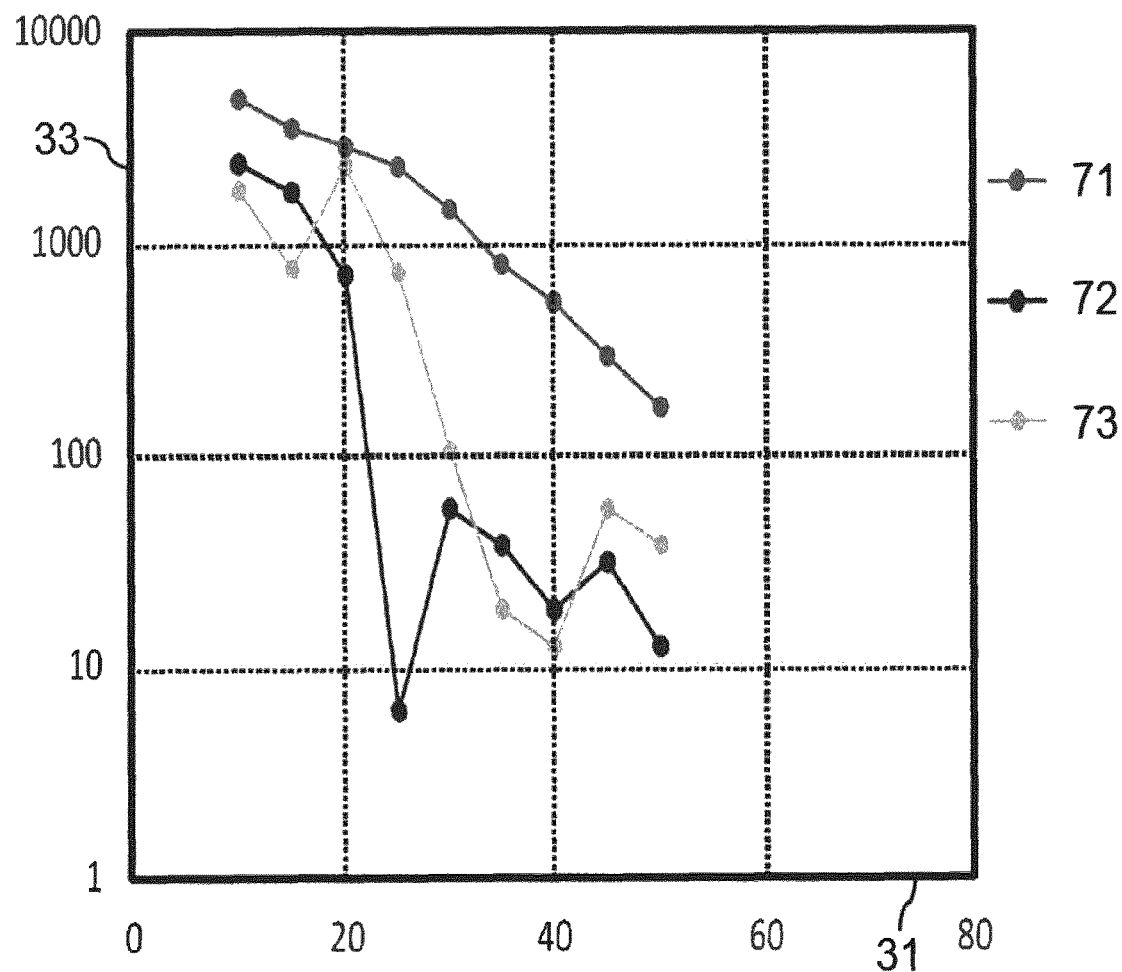
FIG. 7 shows the modulation amplitude dependence of compensation of the second embodiment at a modulation frequency of 200 MHz.

FIG. 7 shows the modulation amplitude dependence of suppression of false-positive particles counts of the second embodiment at a modulation frequency of 200 MHz. The labels of the axes are the same as discussed with respect to FIG. 4 and FIG. 6. Line 71 is characterized by a modulation amplitude of 0.15 V, line 72 is characterized by a modulation amplitude of 0.3 V and line 73 is characterized by a modulation amplitude of 0.45 V. line 73 shows that the higher modulation frequency of 200 MHz gives better suppression of false-positive particle counts towards smaller distances 31, but require at the same time a higher modulation amplitude of 0.45 V in comparison to the optimum modulation amplitude of 0.2 V shown in FIG. 6. The optimum modulation amplitude therefore depends on the modulation frequency as indicated above and is well in accordance with the theoretical analysis provided below.

Figure 8:
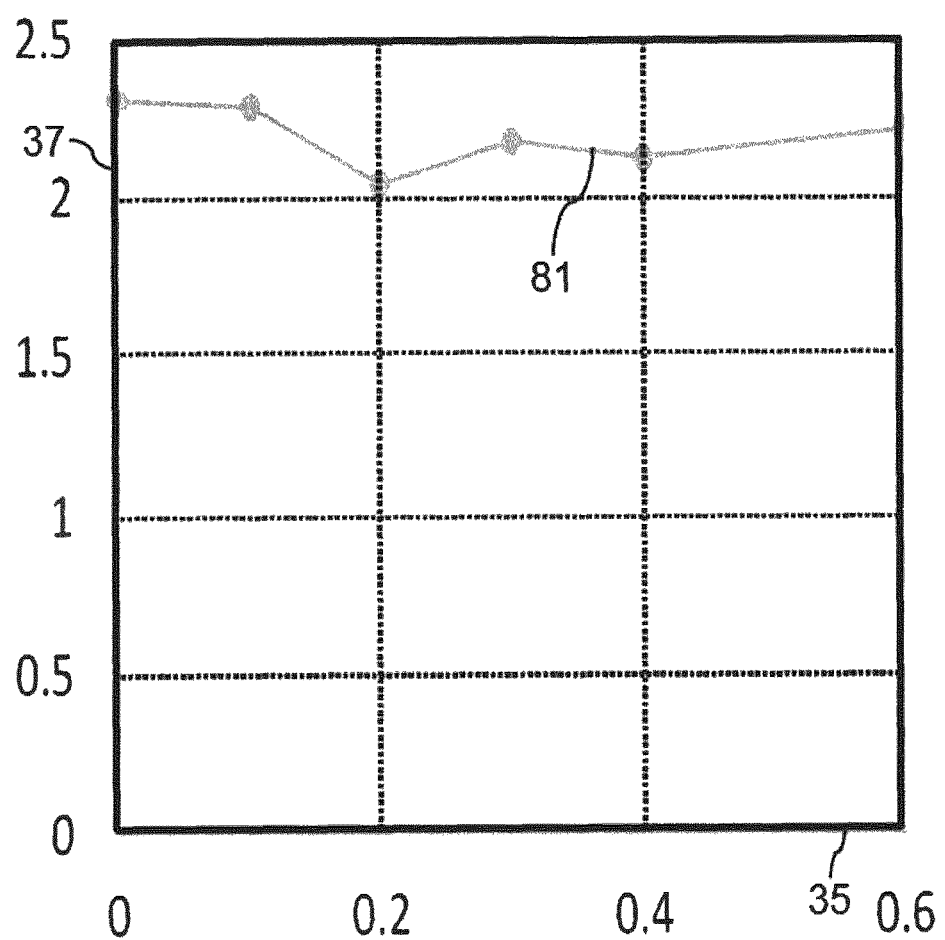
FIG. 8 shows measurement results of control measurements.

FIG. 8 shows measurement results of control measurements 81 at a modulation frequency of 93.3 MHz showing that the high-frequency signal has no effect on the count rate of the particle sensor if there is no macroscopic object. The ordinate shows the counts per second at a reference particle concentration of 33 μg/m$^3$ 37 and the abscissa the voltage modulation amplitude 35 in [V]. Suppression of false-positive particle counts by means of a high-frequency signal does not disturb determination of particle density and is therefore reliable.

Figure 9:
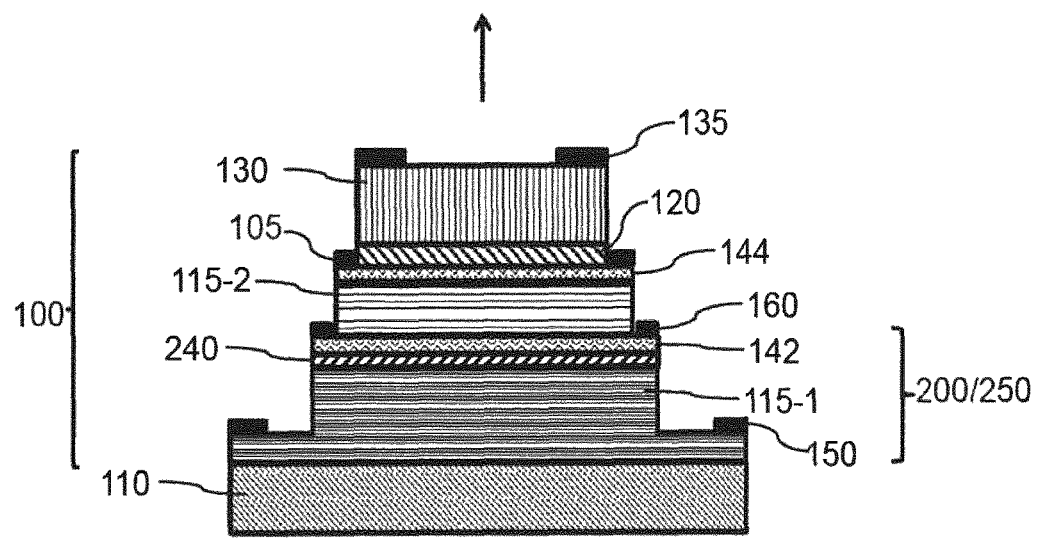
FIG. 9 shows a principal sketch of a second VCSEL with integrated light detector.

FIG. 9 shows a principal sketch of a second VCSEL 100 with integrated light detector 200 and electro-optical modulator 250. The light detector 200 comprises in this embodiment a pin junction as discussed above and is simultaneously be used as electro-optical modulator 250. The general configuration is similar as discussed with respect to FIG. 1. The main difference is that there is a strict separation between the electrical contacts 105, 135 used for electrically pumping the active layer 120 and the electrical contacts 150 and 160 used to contact the light detector 200 and electro-optical modulator 250. The separation of electrical contacting of the active layer 120 and the detector layer arrangement 240 may be beneficial in order to reduce crosstalk when applying the high-frequency signal. Furthermore, a first current distribution layer 142 is shown which is in direct contact with a fourth electrical contact 160 and a second current distribution layer 144 is shown which is in direct contact with the first electrical contact 105. The current distribution layers are used to tune current distribution within the VCSEL 100.

Figure 10:
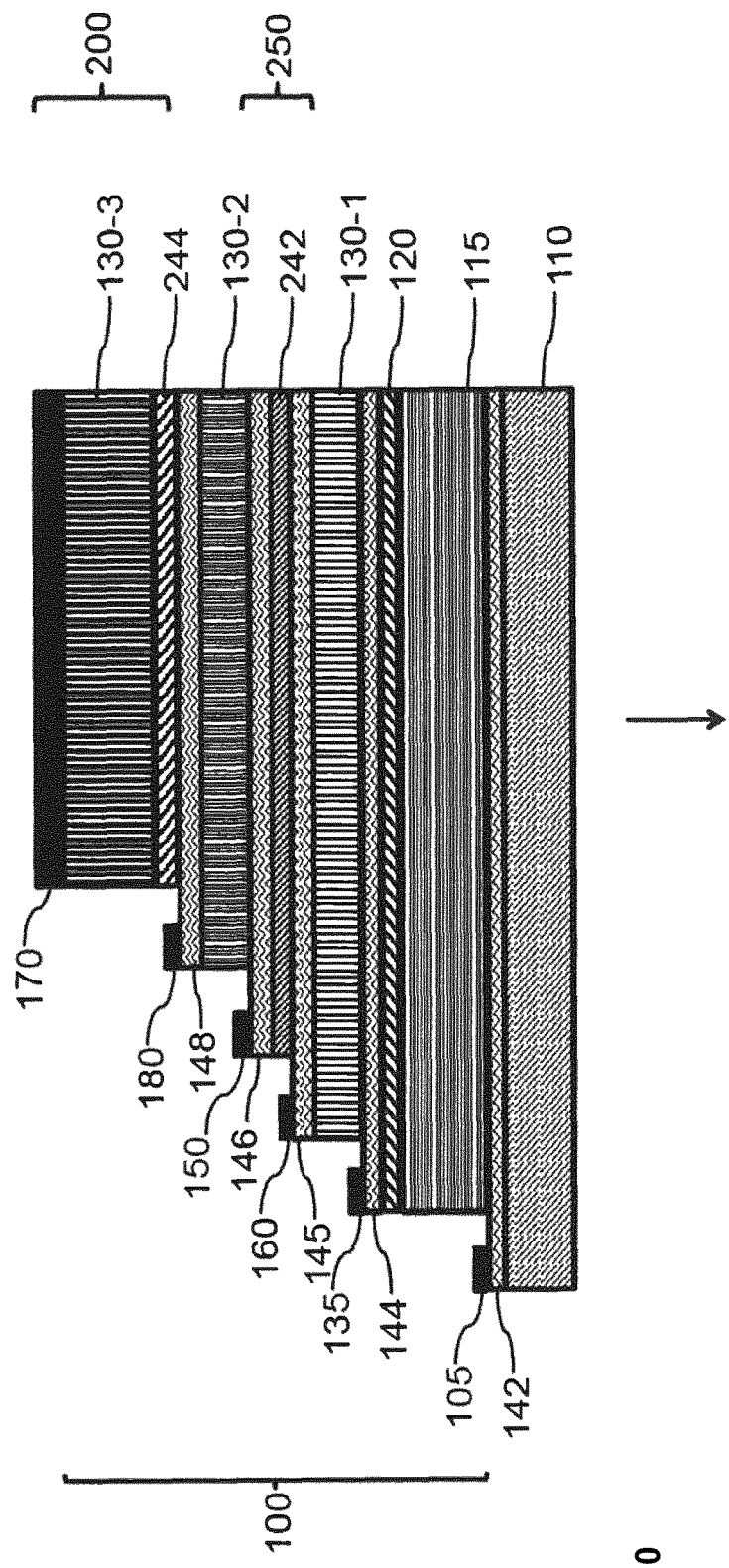
FIG. 10 shows a principal sketch of a third laser sensor module.

FIG. 10 shows a principal sketch of a third laser sensor module comprising a VCSEL 100 which is arranged to emit laser light via a substrate 110 (bottom emitter). The semiconductor layers of the VCSEL 100 are deposited on the substrate 110 and a first current distribution layer 142 is provided on the substrate 110. The first current distribution layer 142 is electrically contacted by means of a first electrical contact 105. A first DBR 115 is deposited on the first current distribution layer 142. An active layer 120 is provided on top of the first DBR 115. A second current distribution layer 144 is provided on top of the active layer 120. The second current distribution layer 144 is electrically connected by means of a second electrical contact 135 to enable electrical pumping of the active layer 120 by means of an electrical drive current provided via the first electrical contact 105 and the second electrical contact 135. The first DBR 115 comprises a current confinement layer to confine the electrical drive current to a defined region of the active layer 120. A first part of a second DBR 130-1 is provided on top of the second current distribution layer 144. A third current distribution layer 145 is provided on top of the first part of the second DBR 130-1 and electrically contacted by means of a fourth electrical contact 160. A modulator layer arrangement 242 is provided on top of the third current distribution layer 145 and a fourth current distribution layer 146 is provided on top of the modulator layer arrangement 242. The fourth current distribution layer 146 is electrically contacted by means of a third electrical contact 150. The modulator layer arrangement 242 comprises at least one layer of material which is arranged such that a refractive index of this at least one layer of material can be tuned or changed by means of an electrical field applied by means of the third electrical contact 150 and the fourth electrical contact 160. The third current distribution layer 145, the modulator layer arrangement 242, the fourth current distribution layer 146 and the corresponding electrical contacts 150, 160 build an electro-optical modulator 250 with a layer thickness λ given by the emission wavelength of the VCSEL 100 taking into account the refractive indices of the layers comprised by the electro-optical modulator 250. A second part of the second DBR 130-2 is provided on top of the fourth current distribution layer 146 and a fifth current distribution layer 148 is provided on top of the second part of the second DBR 130-2. The fifth current distribution layer 148 is electrically contacted by means of a sixth electrical contact 180. A detector layer arrangement 244 is provided on top of the fifth current distribution layer 148 and a third part of the second DBR 130-3 is provided on top of the detector layer arrangement 244. A fifth electrical contact 170 covers the third part of the second DBR 130-3. The fifth current distribution layer 148, the detector layer arrangement 244 and the third part of the second DBR 130-3 built together with the corresponding electrical contacts 170, 180 a light detector 200 (e.g. photo transistor). The electro-optical modulator 250 and the light detector 200 are in this embodiment separate devices with separate electrical contacts. The electro-optical modulator 250 may, for example, alternatively be arranged in the first DBR 115. Furthermore, the sequence of the electro-optical modulator 250 and the light detector 200 within the layer stack of the VCSEL 100 may be exchanged. The growth substrate 110 may finally be removed.

Figure 11:
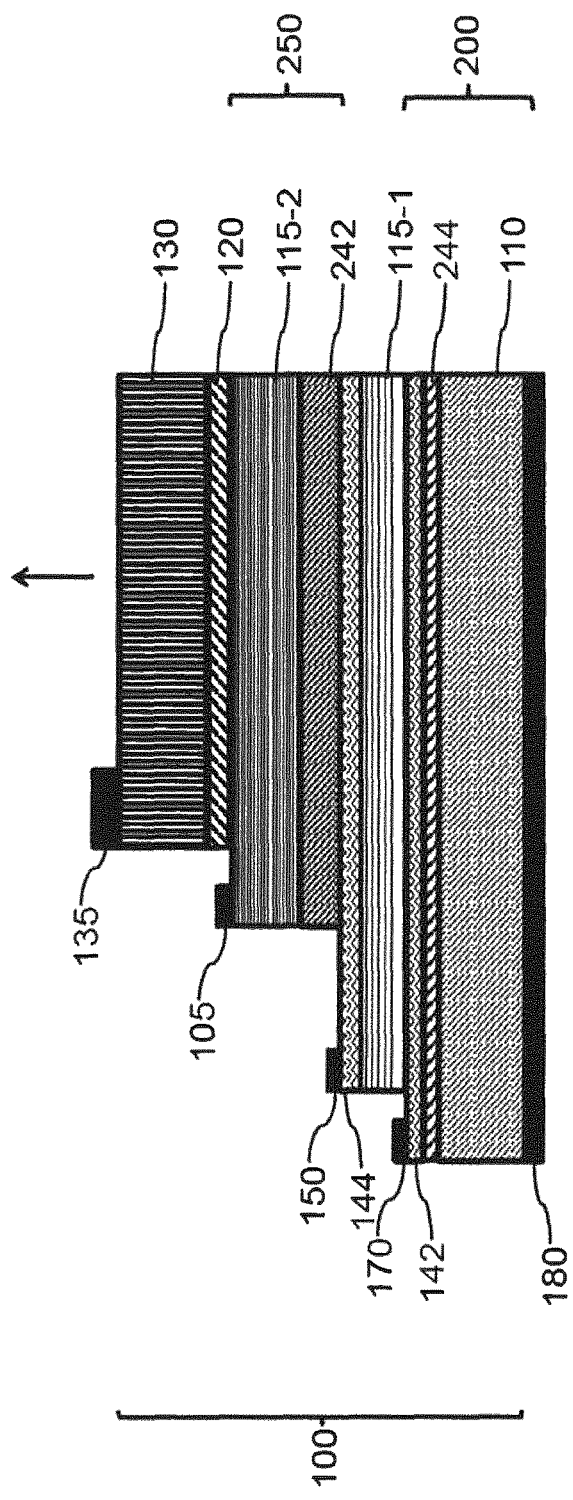
FIG. 11 shows a principal sketch of a fourth laser sensor module.

FIG. 11 shows a principal sketch of a fourth laser sensor module comprising a top emitting VCSEL 100. The VCSEL 100 comprises a substrate 110. On a first side of the substrate 110 is a sixth electrical contact 180 provided and on a second side of the substrate is a detector layer arrangement 244 provided. On top of the detector layer arrangement 244 is a first current distribution layer 142 provided which is electrically connected by means of a fifth electrical contact 170. The sixth electrical contact 180, the conductive substrate 110, the detector layer arrangement 244, the first current distribution layer 142 and the fifth electrical contact built a light detector 200 (e.g. photo diode). A first part of a first DBR 115-1 is provided on top of the first current distribution layer 142. A second current distribution layer 144 is provided on top of the first part of the first DBR 115-1. The second current distribution layer 144 is electrically connected by means of a third electrical contact 150. A modulator layer arrangement 242 similar as discussed with respect to FIG. 10 is provided on top of the second current distribution layer 144. A second part of the second DBR 115-2 is provided on top of the modulator layer arrangement 242. The uppermost layer of the second DBR 115-2 is electrically connected by means of a first electrical contact 105. The second current distribution layer, the modulator layer arrangement 242, the second part of the second DBR 115-2 and the corresponding electrical contacts 105, 150 built an electro-optical modulator 250 similar as discussed with respect to FIG. 10. An active layer 120 is provided on top of the second part of the first DBR 115-2 and a second DBR 130 is provided on top of the active layer 120. A ring shaped second electrical contact 135 is provided on the uppermost layer of the second DBR 130 to enable electrical pumping of the active layer 120 via the first electrical contact 105 and the second electrical contact 135. Other embodiments may use one electrode to contact two functional elements (laser, light detector 200, electro-optical modulator 250) of the VCSEL 100 as described, for example, with respect to FIG. 1 and FIG. 6. The third electrical contact 150 or alternatively the fifth electrical contact 170 may, for example, be used to electrically contact the light detector 200 and the electro-optical modulator 250. Design of the respective VCSEL at 100 may in this case be simplified.

Figure 12:
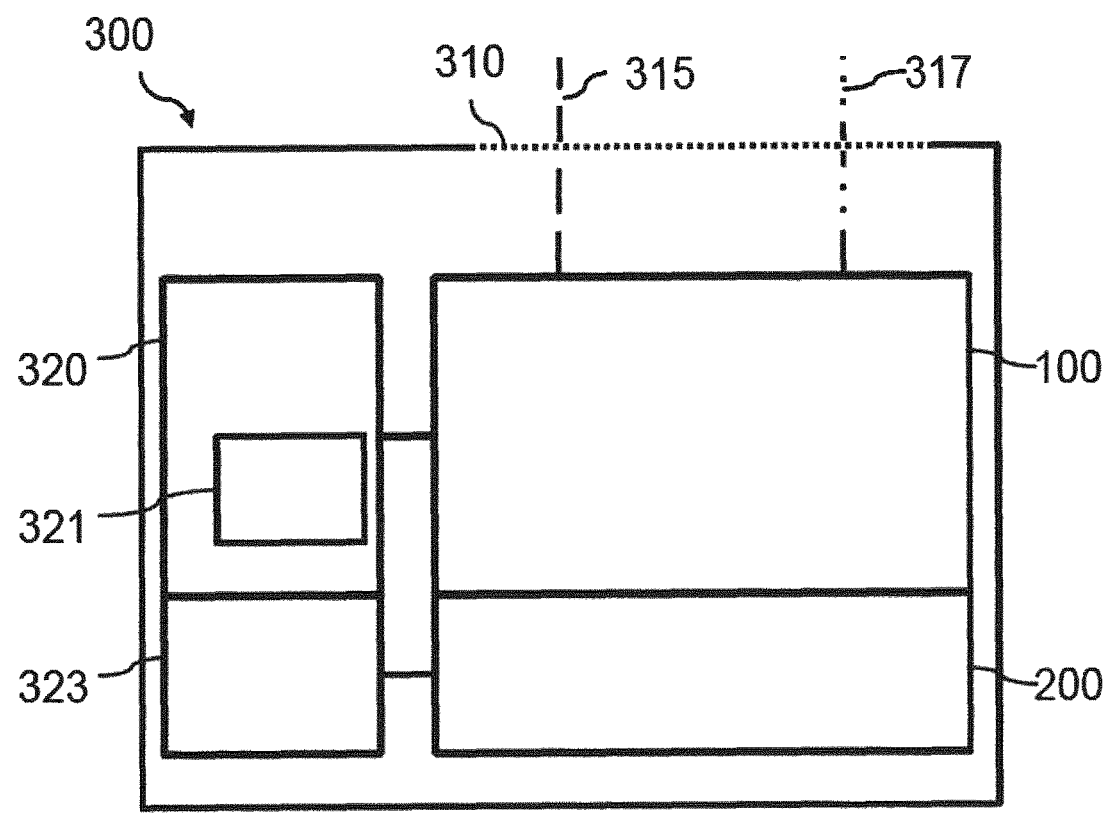
FIG. 12 shows a principal sketch of a first laser sensor.

FIG. 12 shows a principal sketch of a first laser sensor 300. The first laser sensor 300 comprises a VCSEL 100 as described above, a transmission window 310 and a driving circuit 320 for electrically driving the VCSEL 100. The driving circuit 320 is electrically connected to the VCSEL 100 to supply electrical power to the VCSEL 100 in a defined way. The driving circuit 320 comprises a memory device for storing data and instructions to operate the driving circuit 320 and a processing unit for executing data and instructions to operate the driving circuit 320. The driving circuit further comprises a tuning circuit 321 for providing a high-frequency signal to the laser (VCSEL 100). The laser sensor 300 further comprises a light detector 200 integrated in the semiconductor layer structure of the VCSEL 100 and an evaluator 323. The VCSEL 100 emits laser light 315. A part of the laser light 315 is reflected by a macroscopic object (not shown) or particles such that reflected laser light 317 enters the optical resonator of the VCSEL 100 resulting in a self-mixing interference signal which is detected by means of the light detector 200. The detected self-mixing interference signal is received and evaluated by evaluator 323 to determine a particle density. The high-frequency signal provided by the tuning circuit 321 suppresses detection of false-positive particle counts as described above which may be caused by the macroscopic object.

Figure 13:
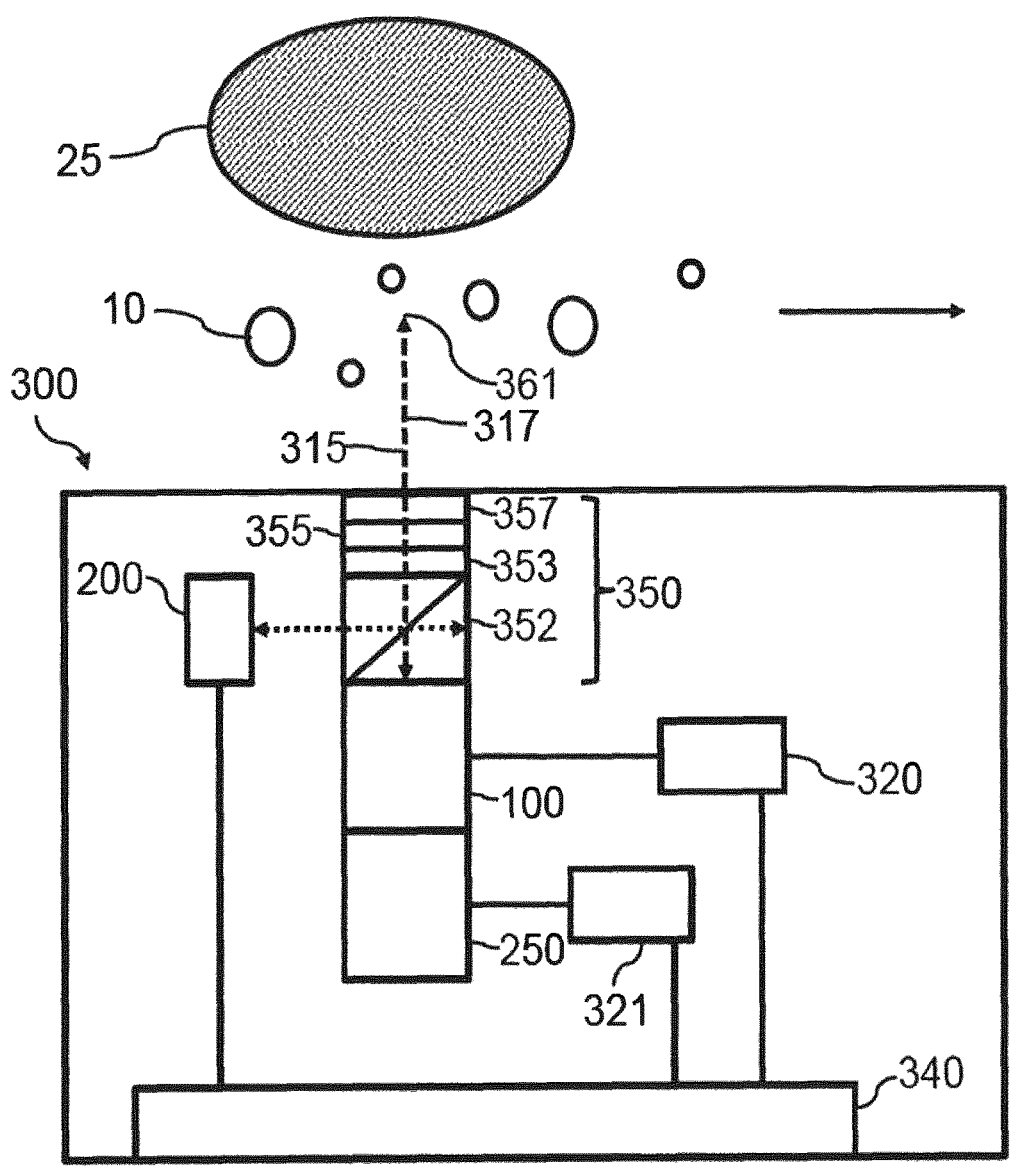
FIG. 13 shows a principal sketch of a second laser sensor.

FIG. 13 shows a second laser sensor 300 which is arranged to detect a particle density and optionally macroscopic objects 25 based on interference measurements. The laser sensor 100 comprises in this embodiment and for clarity reasons only one first laser (e.g. VCSEL 100) to discuss the measurement principle. Extension to two, three or more lasers and corresponding light detectors 200 is straightforward. The first laser emits laser light to a polarizing beam splitter 352. The laser light is partly reflected at the polarizing beam splitter 352 and passes a quarter wavelength plate 353, an optical filter device 355 and a focusing device 357. The quarter wavelength plate 353 is set with its optical axis at 45° with respect to the polarization direction of the first laser. In this way, circular polarized light is made. The optical filter device 355 is characterized by a narrow passband around the emission wavelength of the first laser (e.g. 850 nm). The optical filter device 355 is optimized to suppress ambient light and is only necessary if ambient light may cause detection problems. The focusing device 357 may, for example, be a lens or a lens or an arrangement comprising more than one optical device. The second laser sensor 300 is arranged such that a defined part of the laser light is reflected at one of the interfaces (e.g. interface between the optical filter device 355 and air) before the laser light leaves the second laser sensor 300. The part of the laser light leaving the second laser sensor 300 is the emitted laser light 315 which is focused to the focus region 361 (measurement volume). Particles 10 reflect a part of the first emitted laser light 315 such that a part of the reflected laser light 317 reenters the second laser sensor 300. The reflected light reentering the second laser sensor 300 passes the focusing device 357, the optical filter 355 and the quarter wavelengths plate 353. Linear polarized light passes the polarizing beam splitter 352 and interferes with the laser light reflected at one of the interfaces before leaving the second laser sensor 300. A first light detector 200 (e.g. photo diode) detects the interfering light and a corresponding measurement signal is transmitted to evaluator 340. Particle density may be determined based on the number of particles determined in a given time period and the particle velocity. A tuning circuit 321 provides a high-frequency signal to the electro-optical modulator 250 as described above to suppress false-positive particle counts caused by a macroscopic object 25. The second laser sensor 300 may optionally be arranged to determine the macroscopic object 25 (e.g. finger) by switching off the high-frequency signal provided to the electro-optical modulator 250 in predetermined time periods and comparing the measurement signals determined in these time periods with measurement signals in preceding or subsequent time periods.

Figure 14:
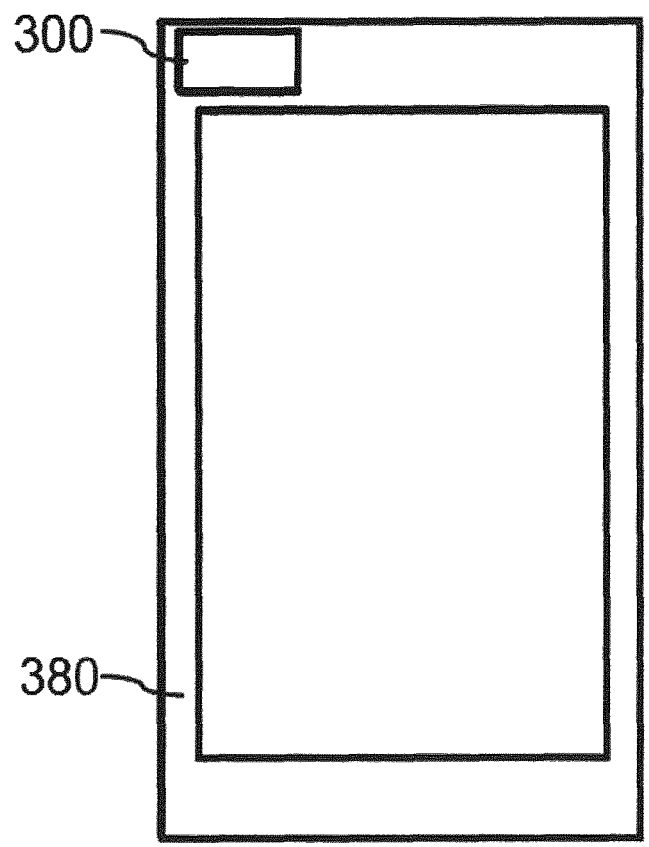
FIG. 14 shows a principal sketch of a mobile communication device.

FIG. 14 shows a principal sketch of a mobile communication device 380 comprising an optical sensor 300 similar as described with respect to FIG. 10 (comprising, for example, three lasers and corresponding light detectors 200). The optical sensor 300 can, for example, be used in combination with a software application running on the mobile communication device 380. The software application may use the optical sensor 300 to determine air-quality based on, for example, the PM 2.5 value.

Figure 15:
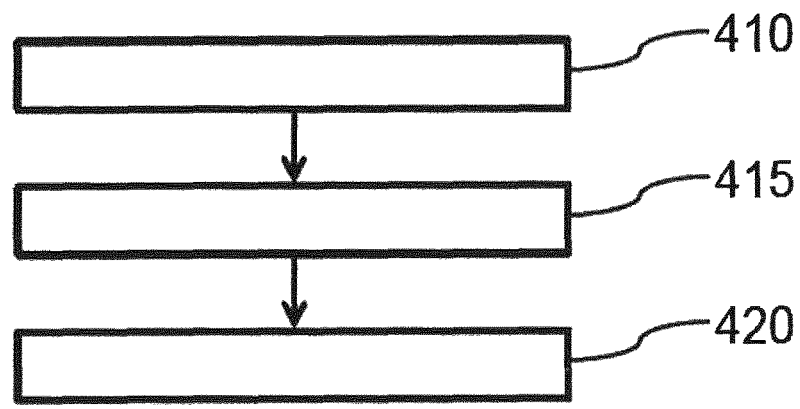
FIG. 15 shows a principal sketch of a method of reduction of false-positive particle counts.

FIG. 15 shows a principal sketch of a method of reduction of false-positive particle counts detected by an interference particle sensor module, preferably a self-mixing interference particle sensor module. The interference particle sensor module comprises a laser and a light detector 200. Laser light 315 is emitted by means of the laser in step 410. In step 415 a high-frequency signal is provided to the laser or the light detector 200 or any other structure comprised by the particle sensor module during the emission of the laser light 315 such that the high-frequency signal results in a wavelength modulation of the emitted laser light 315. An optical response is detected by means of the light detector 200 in step 420 when providing the high-frequency signal in reaction to the emitted laser light. The high-frequency signal is arranged such that a detection signal caused by a macroscopic object 25 positioned in a range between a threshold distance and a detection range of the particle sensor module is reduced in comparison to a detection signal caused by the macroscopic object 25 at the same position without providing the high-frequency signal.

Some theoretical considerations with respect to interference and especially self-mixing interference current modulation.

1.1 SMI without Current Modulation

A simplified model is to view the SMI as interference between back reflected light from an external object and the laser light. The back reflected light can come either from a particle or from an unwanted external object.

When the object is out of focus the magnitude of the reflected light that ends up in the cavity is reduced. Unfortunately for the VIP 8.1 the distance up to which this still can influence the laser light is quite long, around 80 cm. The unwanted reflection is likely to come from an object that is not standing still on wavelength scale (1 µm). This will cause the phase of the reflected light to vary and will result in a detectably intensity change in the laser light.

$$I_{tot} \propto |E_{laser} + E_{backreflected}|^2 \approx I_{laser} + E_{laser}E^*_{backreflected} + c.c. \quad (1.1)$$

$$\delta I_{SMI}(t) \propto E_{laser}E^*_{backreflected} + c.c. = E_{laser}(t)E^*_{laser}(t-\tau) + c.c. \quad (1.2)$$

$$\tau = \frac{2L}{c} \quad (1.3)$$

In case of no wavelength change the variation in laser output power results from the change in distance/phase of the backreflection, this can be expressed via a different length of the cavity, L(t) or a different roundtrip time, r(t)=2L(t)/c.

$$\delta I_{SMI}(t) \propto 2\text{Re}\left(I_{laser}e^{2\pi i f \tau(t)}\right) = 2\text{Re}\left(I_{laser}e^{2\pi i \frac{2L(t)}{\lambda}}\right) \quad (1.4)$$

Both the particles and an obstruction will give rise to SMI interference effect.

1.2 SMI with Current Modulation

When the laser current is modulated both the amplitude and the optical frequency (or wavelength) of the laser light will change. This will also give rise to a varying laser power when the light reflects from a distant object back into the laser cavity.

The laser field can be described as:

$$E(t) = e^{2\pi i f_0 t} e^{2\pi i \int_{-\infty}^t \delta f(t)dt}(A_0 + \delta A(t)) \quad (1.5)$$

The back reflected field has a phase that takes the additional roundtrip of the external cavity into account:

$$E_{back}(t)=E(t-\tau)=e^{-2\pi i f_0 \tau}e^{2\pi i \int_{t-\tau}^{t}\delta F(t)dt}(|A_0|^2+A_0*\delta A(t)) \quad (1.6)$$

The SMI Term:

$$E(t)E^*(t-\tau)=e^{-2\pi i f_0 \tau}e^{2\pi i \int_{t-\tau}^{t}\delta F(t)dt}(|A_0|^2+A_0*\delta A(t)+A_0\delta A^*(t-\tau)+\delta A(t)\delta A^*(t-\tau)) \quad (1.7)$$

The first phase term is due to changes in phase due to movement of the distant reflector, the second phase term is due to frequency change from current modulation and also gives rise to interference. Note that the distance via τ influences the magnitude of the phase change due to current fluctuation.

1.3 Sinusoidal Current Modulation

In order to arrive at the origin of the minimum in the response to a distant object reflector, we consider the case of a sinusoidal current modulation. This leads to the following frequency modulation, $f(t)=\Delta f \cos(2\pi f_{mod} t)$. The phase modulation resulting from this is:

$$\int_{t-\tau}^{t} \Delta f \cos(2\pi f_{mod} t) = \frac{\Delta f}{2\pi f_{mod}}(\sin(2\pi f_{mod} t) - \sin(2\pi f_{mod}(t-\tau))) \quad (1.8)$$

$$= 2\frac{\Delta f}{2\pi f_{mod}}\sin(\pi f_{mod}\tau)\cos\left(2\pi f_{mod}\left(t-\frac{\tau}{2}\right)\right). \quad (1.9)$$

This is a periodic phase modulation. Δf is determined by the amplitude of the current modulation, τ is determined by the roundtrip time, 2L/c of the external reflection, $f_{mod}$ is the modulation frequency of the current.

Using the Jacobi Anger expansion, the phase modulation can be decomposed into its harmonic components.

$$e^{iz\cos(\theta)} = \sum_{n=-\infty}^{n=\infty} J_n(z)i^n e^{in\theta} e^{-i\frac{2\Delta f}{f_{mod}}\sin(\pi f_{mod}\tau)\cos(2\pi f_{mod}(t-\frac{\tau}{2}))} = \sum_{n=-\infty}^{n=\infty} J_n\left(\frac{2\Delta f}{f_{mod}}\sin(\pi f_{mod}\tau)\right)i^n e^{2\pi i n f_{mod}(t-\frac{\tau}{2})} \quad (1.10)$$

The amplitude of the frequency component is given by the Bessel function argument $J_n(\Delta f/f_{mod} \sin(\pi f_{mod} \tau))$.

1.4 SMI Effect with HF Current Modulation

The observed effect of additional particle counts due to an obstruction is caused by the SMI effect around DC, the harmonics of the signal are at such high frequencies that the SMI spectrum around these frequencies is not visible at the detector. So in order to analyze the amplitude of the SMI effect we can concentrate on the values at low frequencies. The SMI term is:

$$E(t)E^*(t-\tau)e^{-2\pi i f_0 \tau}\left(\sum_{n=-\infty}^{n=\infty} J_n\left(\frac{2\Delta f \sin(\pi f_{mod}\tau)}{f_{mod}}\right)i^n e^{2\pi i n f_{mod}(t-\frac{\tau}{2})}\right) \quad (1.11)$$

$$(|A_0|^2 + A_0^*\Delta A e^{-2\pi i f_{mod}(t-\tau)}|\Delta A|^2.$$

the first phase term corresponds to the effect of movement of distant reflector, second term contains phase modulation resulting from the current modulation, third term result from the amplitude modulation due to the current modulation For simplicity we assume that the resulting amplitude modulation is small such that variation in amplitude can be neglected, second the variation in τ due to movement of distant reflector gives a spectrum which is considered to be low frequent with respect to the modulation frequency. The remaining DC component of the signal with these assumptions:

$$(E(t)E^*(t-\tau))_{DC} = e^{-2\pi i f_0 \tau}J_0\left(\frac{2\Delta f \sin(\pi f_{mod}\tau)}{f_{mod}}\right)|A_0|^2. \quad (1.12)$$

The amplitude of the DC term is determined by the amplitude of the Bessel function $J_0$, and depends on the amplitude of the frequency modulation Δf, the roundtrip time of the external reflection, τ, and the modulation frequency $f_{mod}$. When the argument of the Bessel function is such that its value is zero the zero order disappears. As the position where particles are detected is much closer.

Figure 16:
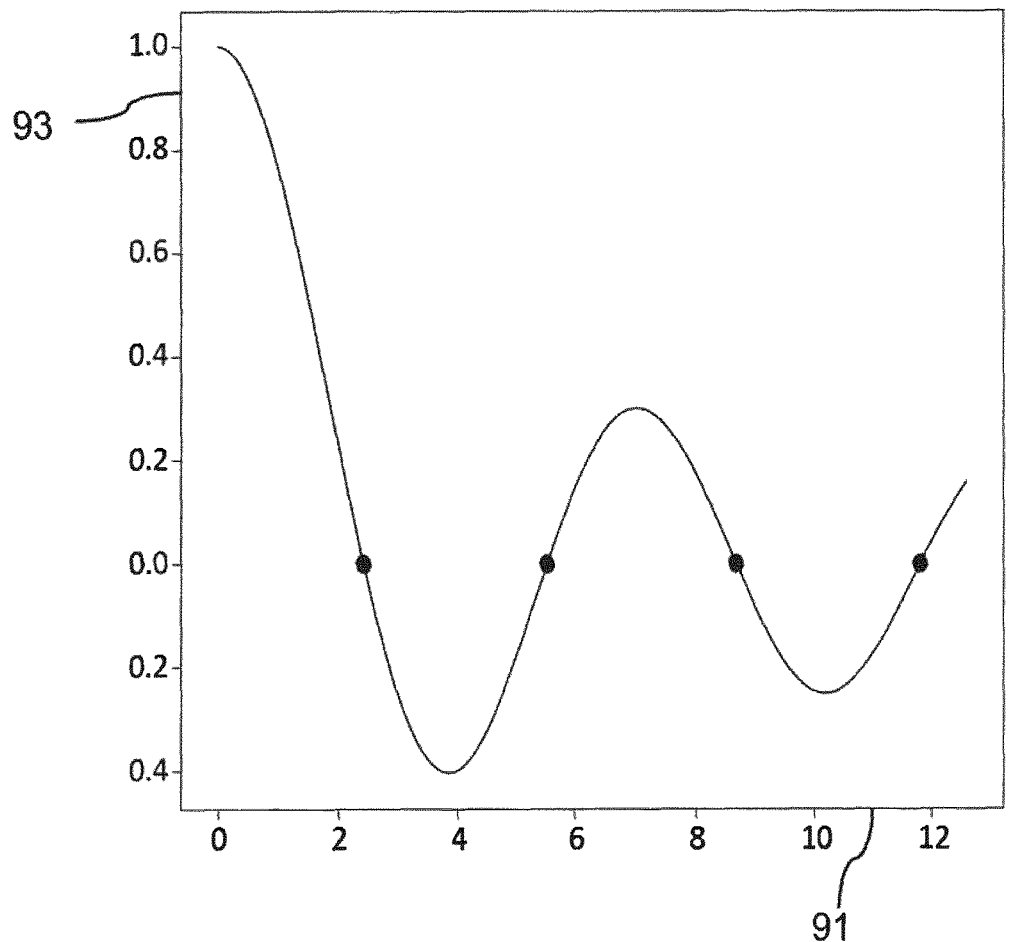
FIG. 16 shows the magnitude of the DC component for a given value of the argument of the zero order Bessel function.

FIG. 16 shows the magnitude of the DC component 93 for a given value of the argument of the zero order Bessel function 91. The dots indicate the zero crossings. When the arguments of the Bessel function are such then the DC order is missing, than where an obstruction is the particle signals have a small phase modulation and the harmonics of the frequency modulation have a very small amount of power most of the power remains around DC.

1.5 Simple Laser Model

In order to model the laser output due to current modulation, we model the Amplitude part and the phase part of the laser emission. The current is represented by $i(t)=i_0+\delta i(t)$, the amplitude modulation follows from a linear dependence between output power and current, $$\delta P(t) = \alpha \delta I(t) \quad (1.13).$$

The coefficient α is the slope efficiency of the laser, the laser response to changes in current is for timescales<1 ns almost instantaneous.

This in contrast to the phase response of the laser, the frequency of the laser is changed due to thermal heating effect of the current, this has a time constant of around 0.5 µs (assuming a first order filter response). This results in a frequency modulation of:

$$\delta f(t) = \frac{c}{\lambda_0^2} \int_0^\infty \delta i(t - t'\beta)(t')dt'. \quad (1.14)$$

Here β(t) is the impulse response of a first order filter.

In order to calculate the amount of the modulation at DC it is sufficient to calculate the DC content of the signal in 1 period.

$$DC \text{ amplitude} = \int_{-\frac{T}{2}}^{\frac{T}{2}} (E(t)E^*(t-\tau) + E^*(t)E(t-\tau))dt \quad (1.15)$$

Here $$\tau = \frac{2L}{c}$$

is the delay due to the roundtrip of the external reflection of the light, and T is the time of one period of the HF modulation pattern.

1.6 Special Waveform with Frequencies at Nyquist

A proposal of a waveform with all frequencies at the Nyquist frequency is the following: A Square wave with the frequency at half the sample rate is multiplied by a square wave at frequency at a multiple of the sample rate.

The one period of the wave is described by the rectangular function, this function is 0, for |t|>T/4, 1/2, for |t|=T/4, and 1 for |t|<T/4. The Fourier transform of the rectangular function is T/2 sin c(T/2f). To get a periodic function one period is multiplied by a Dirac comb function, $^P_n\delta(t-nT)$. The Fourier transform of the Dirac comb is again a Dirac comb with spacing 1/T, $1/T^P_k\delta(f-k/T)$. Using this representation, we can calculate the spectrum of this waveform.

$$\mathcal{F}\left((rect(t/T-1))\sum_{n=\infty}^{\infty}\delta(t-nT)\right) \to 1/2sinc(Tf)\sum_{k=-\infty,k\neq 0}^{\infty}\delta\left(f-\frac{k}{T}\right) \quad (1.16)$$

$$\mathcal{F}\left(\left((rect(t/T-1))\sum_{n=\infty}^{\infty}\delta(t-nT)\right)\left((rect(pt/T-1))\sum_{n=\infty}^{\infty}\delta(t-nT)\right)\right)\cdot p \in \mathbb{N}^+ \quad (1.17)$$

While the invention has been illustrated and described in detail in the drawings and the foregoing description, such illustration and description are to be considered illustrative or exemplary and not restrictive.

From reading the present disclosure, other modifications will be apparent to persons skilled in the art. Such modifications may involve other features which are already known in the art and which may be used instead of or in addition to features already described herein.

Variations to the disclosed embodiments can be understood and effected by those skilled in the art, from a study of the drawings, the disclosure and the appended claims. In the claims, the word "comprising" does not exclude other elements or steps, and the indefinite article "a" or "an" does not exclude a plurality of elements or steps. The mere fact that certain measures are recited in mutually different dependent claims does not indicate that a combination of these measures cannot be used to advantage.

Any reference signs in the claims should not be construed as limiting the scope thereof.

While embodiments of the invention have been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

LIST OF REFERENCE NUMERALS

10 particle
25 macroscopic object
31 distance [cm]
33 counts per 30 seconds
35 voltage modulation amplitude [V]
37 counts per second @ 33 µg/m³
41 no HF modulation
42 100 MHz
43 200 MHz
44 300 MHz
45 400 MHZ
51 0 V
52 0.2 V
53 0.3 V
54 0.4 V
55 0.5 V
56 0.6 V
57 no paper
61 0 V
62 0.1 V
63 0.15 V
64 0.2 V
65 0.25 V
66 0.3 V
71 0.15 V
72 0.3 V
73 0.45 V 81 control measurement
91 argument of the zero order Bessel function
93 magnitude of the DC component
100 Vertical Cavity Surface Emitting Laser (VCSEL)
105 first electrical contact
110 substrate
115 first distributed Bragg reflector
115-1 first part of first distributed Bragg reflector
115-2 second part of first distributed Bragg reflector
120 active layer
130 second distributed Bragg reflector
130-1 first part of second distributed Bragg reflector
130-2 second part of second distributed Bragg reflector
130-3 third part of second distributed Bragg reflector
135 second electrical contact
142 first current distribution layer
144 second current distribution layer
145 third current distribution layer
146 fourth current distribution layer
148 fifth current distribution layer
150 third electrical contact
160 fourth electrical contact
170 fifth electrical contact
180 sixth electrical contact
200 light detector
240 detector layer arrangement
242 modulator layer arrangement
244 detector layer arrangement
250 electro-optical modulator
300 laser sensor
310 transmission window
315 emitted laser light
317 reflected laser light
320 driving circuit
321 tuning circuit
321-a HF generator
321-b passive network
323 evaluator
340 interface
350 optical arrangement
352 beam splitter
353 quarter wavelength plate
355 optical filter device
357 focusing device
361 focus region
380 mobile communication device
410 step of emitting laser light
415 step of tuning optical resonator
420 step of determining optical response

The invention claimed is:

1. A method of reducing false-positive particle counts detected by an interference particle sensor module wherein the interference particle sensor module comprises a laser and a light detector, the method comprising:
    emitting laser light by the laser;
    providing a high-frequency signal to the interference particle sensor module during the emission of the laser light, wherein a modulation frequency of the high-frequency signal is in the range of 10 MHz to 500 MHZ;
    detecting an optical response by the light detector in reaction to the emitted laser light during the providing of the high-frequency signal, wherein the high-frequency signal is arranged such that a detection signal caused by a macroscopic object positioned in a range between a first distance and a second distance of the particle sensor module is reduced in comparison to a detection signal caused by the macroscopic object at the same position without providing the high-frequency signal,
    wherein the high-frequency signal is provided to a tuning structure of the particle sensor module which is arranged to modify a resonance frequency of an optical resonator comprised by the laser sensor module upon reception of the high-frequency signal.

2. The method according to claim 1, wherein the optical response is sampled at a sample frequency fs, and wherein the modulation frequency is given by (n+0.5)*fs, with n being a natural number greater than zero.

3. The method according to claim 1, wherein a modulation amplitude of the high-frequency signal is chosen such that the detection signal is minimized in the range between the first distance and the second distance.

4. The method according to claim 1, wherein the reduction of the detection signal at the first distance is at least one order of magnitude.

5. The method according to claim 4, wherein the reduction of the detection signal within the range between the first distance and the second distance is at least one order of magnitude.

6. The method according to claim 1, wherein the high-frequency signal is arranged such that the first distance is less than 50 cm.

7. The method according to claim 1, wherein the high-frequency signal causes a high-frequency current modulation of an electrical drive current applied to the laser.

8. The method according to claim 1, wherein the high-frequency signal causes a high-frequency voltage modulation of the light detector.

9. The method according to claim 8, wherein the high-frequency voltage modulation comprises a sawtooth modulation.

10. The method according to claim 1, wherein the tuning structure is an electro-optical modulator which is arranged to modify a resonance frequency of an optical resonator comprised by the laser sensor module upon reception of the high-frequency signal.

11. The method according to claim 1, wherein the method comprises:
    switching off the high-frequency signal in at least one predetermined time interval,
    determining the optical response in the at least one predetermined time interval,
    comparing the optical response determined in the at least one predetermined time interval and the optical response determined in a preceding or subsequent time interval in which the high-frequency signal is switched on, and
    determining a presence of the object based on the comparison.

12. A non-transitory computer readable medium comprising processor executable code, which when executed by at least one processor, is configured to execute the method according to claim 1.

13. The method according to claim 1, wherein the interference particle sensor module is a self-mixing interference particle sensor module.

14. A laser sensor, the laser sensor comprising:
    an interference particle sensor module; the interference particle sensor module comprising:
        a laser; and
        a light detector; and a driving circuit, the driving circuit being arranged to provide an electrical drive current to the laser for emitting laser light, wherein the light detector is arranged to detect an optical response in reaction to the laser light emitted by the laser upon providing the electrical drive current, wherein the laser sensor further comprises a tuning circuit, wherein the tuning circuit is arranged to provide a high-frequency signal to the interference particle sensor module during the emission of the laser light, wherein a modulation frequency of the high-frequency signal is chosen in the range from 10 MHz to 500 MHZ, wherein the high-frequency signal is configured such that a detection signal caused by a macroscopic object positioned in a range between a first distance and a second distance of the particle sensor module is reduced in comparison to a detection signal caused by the macroscopic object at the same position without providing the high-frequency signal, wherein the light detector is configured to receive the detection signal when providing the high-frequency signal, and wherein the tuning circuit is configured to provide the high-frequency signal to a tuning structure of the particle sensor module which is arranged to modify a resonance frequency of an optical resonator comprised by the laser sensor module upon reception of the high-frequency signal.

15. A particle detector, the particle detector comprising:

the laser sensor according to claim 14;

an evaluator;

an optical focusing device configured to focus the emitted laser light to a focus region, wherein the focus region is at a distance to the focusing device of less than 3 cm, wherein the distance is smaller than the first distance, wherein the tuning circuit is configured to provide the high-frequency signal characterized by a modulation frequency and a modulation amplitude, wherein the modulation frequency and the modulation amplitude are configured such that a sensitivity of the laser sensor is reduced at least by one order of magnitude at the first distance, and wherein the evaluator is configured to determine a particle density of particles with a size between 0.05 μm to 10 μm based on measurement signals provided by the light detector.

16. A mobile communication device comprising the laser sensor according to claim 14, wherein the mobile communication device is configured to communicate a particle density determined by of the laser sensor to a user of the mobile communication device.

* * * * *